(12) United States Patent
Abraham et al.

(10) Patent No.: US 6,963,823 B1
(45) Date of Patent: Nov. 8, 2005

(54) PROGRAMMATIC DESIGN SPACE EXPLORATION THROUGH VALIDITY FILTERING AND QUALITY FILTERING

(75) Inventors: Santosh G. Abraham, Pleasanton, CA (US); Robert S. Schreiber, Palo Alto, CA (US); B. Ramakrishna Rau, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/502,194

(22) Filed: Feb. 10, 2000

(51) Int. Cl.[7] .............................. G06F 7/60; G06F 17/10
(52) U.S. Cl. ........................ 703/2; 702/179; 702/181; 702/182; 702/183; 711/3; 711/117; 711/170; 711/210; 711/220; 714/36
(58) Field of Search ................................. 703/14, 15, 1, 703/23, 25; 365/240; 712/215–219, 201, 712/227, 236, 20–22; 700/11, 21, 34, 51, 700/103, 67, 239, 249, 40

(56) References Cited

U.S. PATENT DOCUMENTS

| | | | |
|---|---|---|---|
| 6,226,776 B1 * | 5/2001 | Panchul et al. ................ | 716/3 |
| 6,298,471 B1 * | 10/2001 | Schreiber ..................... | 716/10 |
| 6,374,403 B1 | 4/2002 | Darte et al. | |
| 6,385,757 B1 | 5/2002 | Gupta et al. | |
| 6,408,428 B1 * | 6/2002 | Schlansker et al. ........... | 716/17 |
| 6,438,747 B1 | 8/2002 | Schreiber et al. | |
| 6,457,173 B1 | 9/2002 | Gupta et al. | |
| 6,460,173 B1 * | 10/2002 | Schreiber ..................... | 716/18 |
| 6,490,716 B1 | 12/2002 | Gupta et al. | |
| 6,507,947 B1 | 1/2003 | Schreiber et al. | |
| 6,629,312 B1 | 9/2003 | Gupta | |
| 6,651,222 B2 | 11/2003 | Gupta et al. | |
| 6,853,970 B1 | 2/2005 | Gupta et al. | |

OTHER PUBLICATIONS

Bard-J.F. "A Multiobjective Methodology for Selecting Subsystem Automation Options" Management Science 32: 1628-1641 (Dec. 1986).*
Abraham et al.. "Automatic and Efficient Evaluation of Memory Hierarchies for Embedded Systems" HP Labs. IEEE 1999. p. 114-125.*
Aditya et al. "Automatic Architechural Synthesis of VLIW and EPIC Processors" IEEE 1999 p. 107-113.*
Rau-B.R. "Dynamically Scheduled VLIW Processors". IEEE 1993 p. 80-92.*
Jacome et al. "Lower Bound on Latency for VLIW ASIP Datapaths". IEEE 1999 p. 216-268.*
Gandhi et al. "Multiobjective Optimization of Large-Scale Structures" Jul. 1993 vol. 31 Wright State University p. 1329-1337.*
Zitzler et al., Multiobjective Evolustionary Algorithms: A Comparitive Case Study and the Strength Pareto Approach IEEE vol. 3, No. 4 Nov. 1999 p. 257-271.*

(Continued)

*Primary Examiner*—W. Thomson
*Assistant Examiner*—Tom Stevens

(57) ABSTRACT

Design spaces for systems, including hierarchical systems, are programmatically validity filtered and quality filtered to produce validity sets and quality sets, reducing the number of designs to be evaluated in selecting a system design for a particular application. Validity filters and quality filters are applied to both system designs and component designs. Component validity sets are combined as Cartesian products to form system validity sets that can be further validity filtered. Validity filters are defined by validity predicates that are functions of discrete system parameters and that evaluate as TRUE for potentially valid systems. For some hierarchical systems, the system validity predicate is a product of component validity predicates. Quality filters use an evaluation metric produced by an evaluation function that permits comparing designs and preparing a quality set of selected designs. In some cases, the quality set is a Pareto set or an approximation thereof.

41 Claims, 10 Drawing Sheets

OTHER PUBLICATIONS

Abraham et al., "Automatic and Efficient Evaluation of Memory Hierarchies Embedded Systems" Hewlett-Packard Labs. Palo Alto Calf. Nov. 16-18, 1999. p. 114-125.*

Yang et al., "Multiobjective Scheduling for IC Sort and Test with a Simulation Testbed" IEEE vol. 11, Num 2 May 1998. p. 304-315.*

Schlansker et al., "EPIC: Explicitly Parallel Instruction Computing" Computing Practices Feb. 2000 p. 37-45.*

J.F. Bard, "A Multiobjective Methodology For Selecting Subsystem Automation Options," *Management Science 32*: 1628-1641 (Dec., 1986).

* cited by examiner

PROGRAMMATIC DESIGN SPACE EXPLORATION THROUGH VALIDITY FILTERING AND QUALITY FILTERING

CROSS-REFERENCE TO RELATED APPLICATIONS

This patent application is related to the following U.S. patent applications, commonly assigned and filed on Aug. 20, 1999:

U.S. patent application Ser. No. 09/378,596, now U.S. Pat. No. 6,853,970, entitled AUTOMATIC DESIGN OF PROCESSOR DATAPATHS, by Shail Aditya Gupta and Bantwal Ramakrishna Rau;

U.S. patent application Ser. No. 09/378,293, now U.S. Pat. No. 6,457,173, entitled AUTOMATIC DESIGN OF VLIW INSTRUCTION FORMATS, by Shail Aditya Gupta, Bantwal Ramakrishna Rau, Richard Craig Johnson, and Michael S Schlansker;

U.S. patent application Ser. No. 09/378,601, now U.S. Pat. No. 6,629,312, entitled PROGRAMMATIC SYNTHESIS OF A MACHINE DESCRIPTION FOR RETARGETING A COMPILER, by Shail Aditya Gupta;

U.S. patent application Ser. No. 09/378,395, now U.S. Pat. No. 6,385,757, entitled AUTO DESIGN OF VLIW PROCESSORS, by Shail Aditya Gupta, Bantwal Ramakrishna Rau, Vinod Kumar Kathail, and Michael S. Schlansker;

U.S. patent application Ser. No. 09/378,298, now U.S. Pat. No. 6,507,947 entitled PROGRAMMATIC SYNTHESIS OF PROCESSOR ELEMENT ARRAYS, by Robert U.S. patent application Ser. No. 09/378,397, now U.S. Pat. No. 6,374,403, entitled PROGRAMMATIC METHOD FOR REDUCING COST OF CONTROL IN PARALLEL PROCESSES, by Alain Darte and Robert Schreiber;

U.S. patent application Ser. No. 09/378,431, now U.S. Pat. No. 6,460,173, entitled FUNCTION UNIT ALLOCATION IN PROCESSOR DESIGN, by Robert Schreiber;

U.S. patent application Ser. No. 09/378,295, now U.S. Pat. No. 6,298,471, entitled INTERCONNECT MINIMIZATION IN PROCESSOR DESIGN, by Robert Schreiber;

U.S. patent application Ser. No. 09/378,394, now U.S. Pat. No. 6,490,716, entitled AUTOMATED DESIGN OF PROCESSOR INSTRUCTION UNITS, by Shail Aditya Gupta and Bantwal Ramakrishna Rau;

U.S. patent application Ser. No. 09/378,393, now U.S. Pat. No. 6,438,747, entitled PROGRAMMATIC ITERATION SCHEDULING FOR PARALLEL PROCESSORS, by Robert S. Schreiber, Bantwal Ramakrishna Rau, and Alain Darte; and U.S. patent application Ser. No. 09/378,290, now U.S. Pat. No. 6,408,428, entitled AUTOMATED DESIGN OF PROCESSOR SYSTEMS USING FEEDBACK FROM INTERNAL MEASUREMENTS OF CANDIDATE SYSTEMS, by Michael S. Schlansker, Vinod Kathail, Greg Snider, Shail Aditya Gupta, Scott A. Mahlke, and Santosh G. Abraham.

The above patent applications are hereby incorporated by reference.

TECHNICAL FIELD

The invention pertains to programmatic methods for the preparation of sets of valid, superior system designs for processor systems, components of processor systems, and other systems characterized by discrete parameters.

BACKGROUND OF THE INVENTION

Embedded computer systems are used in a wide range of electronic devices and other equipment, including mobile phones, printers, and cars. These devices are not usually regarded as computer systems, but they nevertheless rely heavily on embedded computer systems to provide key functions, functionality, and features. In many cases, the required computing capabilities of such embedded systems match or exceed the capabilities required of general-purpose computers. Furthermore, embedded systems must often meet severe cost and power dissipation requirements. The number of embedded computers far exceeds the number of more general-purpose computer systems such as PCs or servers and the total value of these embedded computers will eventually exceed that of general-purpose computer systems.

The design process for embedded computers differs from that of general-purpose computer systems. The embedded computer systems have greater design freedom than general-purpose computers because there is little need to adhere to existing standards to run existing software. In addition, since embedded computers are used in specific settings, they can be custom-tuned to a greater degree than a general purpose computer. On the other hand, total sales of a particular embedded computer system are typically insufficient to support a full custom design. Therefore, although there is a greater freedom to customize and the benefits of customization are large, the available design budget is limited. Therefore, automated design tools are needed to capture the benefits of customization while maintaining a low design cost.

The specification of an embedded computer system includes specifications of design parameters for several subsystems. For example, a cache memory can include a unified cache or a split-cache, and these caches can be specified in terms of a cache size, associativity, line size, and number of ports. For example, cache memory design can be specified as an 8 kB 2-way set associative cache with a line size of 32 bytes. The evaluation of cache designs is time-consuming because of the complexity of processor and cache simulation. In addition, the size of the embedded processor design space increases combinatorially with the number of design parameters. As a result, an exhaustive exploration of a typical embedded processor design space is infeasible and improved methods for evaluating designs are needed.

Many other complex systems encounter similar problems. Evaluation of system designs can be slow and expensive, or determining whether a particular combination of design parameters yields a valid design can be difficult. Accordingly, improved methods for identifying valid system designs and determining how well various designs satisfy evaluation criteria are needed.

SUMMARY OF THE INVENTION

Programmatic methods for obtaining validity sets and quality sets of system designs from a design space of designs are provided. For a hierarchical system, component validity filters produce component validity sets. A system validity set is obtained that is a Cartesian product of the component validity sets. In a specific embodiment, component designs are specified by component parameters, and the component validity filters are independent of component parameters of other components, and a system validity filter is applied to the Cartesian product of the component validity sets.

In another specific embodiment, component validity sets for each of the component designs are obtained by applying component validity filters that are defined by corresponding component validity predicates. Component evaluation functions and component quality filters are applied to the component validity sets to form component quality sets. A set of systems designs is then produced that corresponds to a Cartesian product of the component quality sets. In one example embodiment, a system evaluation function and a system quality filter are applied to the set of system designs thus obtained.

In a further specific embodiment, system designs are programmatically selected by selecting and applying a system validity filter to the system designs. The system validity filter is defined by a system validity predicate and a set of selected system designs is produced containing only system designs that satisfy the system validity predicate. In a further embodiment, the system validity predicate is a product of partial validity predicates that are mutually exclusive.

In a method of programmatically selecting a set of selected system designs, a system validity filter is selected that is defined by a system validity predicate. The system validity predicate includes one or more partial validity predicates that define partial validity filters. The partial validity filters are applied to the system designs to form partial validity sets that include system designs satisfying respective partial validity filters. An evaluation function is applied to the system designs of the partial validity sets to produce an evaluation metric for each system design. A quality filter produces respective partial quality sets that are combined to produce a first quality set. In a specific embodiment, the partial validity predicates are mutually exclusive and the system validity predicate is a product of the partial validity predicates. In a further specific embodiment, the quality filter is applied to the first quality set to produce a second quality set.

A method of programmatically selecting a design for a cache memory is also disclosed. Components for the cache memory are selected and component Pareto sets are prepared. A combined Pareto set is prepared from the component Pareto sets, and a cache memory design is selected from the combined Pareto set.

Further features of the invention will become apparent from the following detailed description and accompanying drawings.

DEFINITIONS

Figure 1:
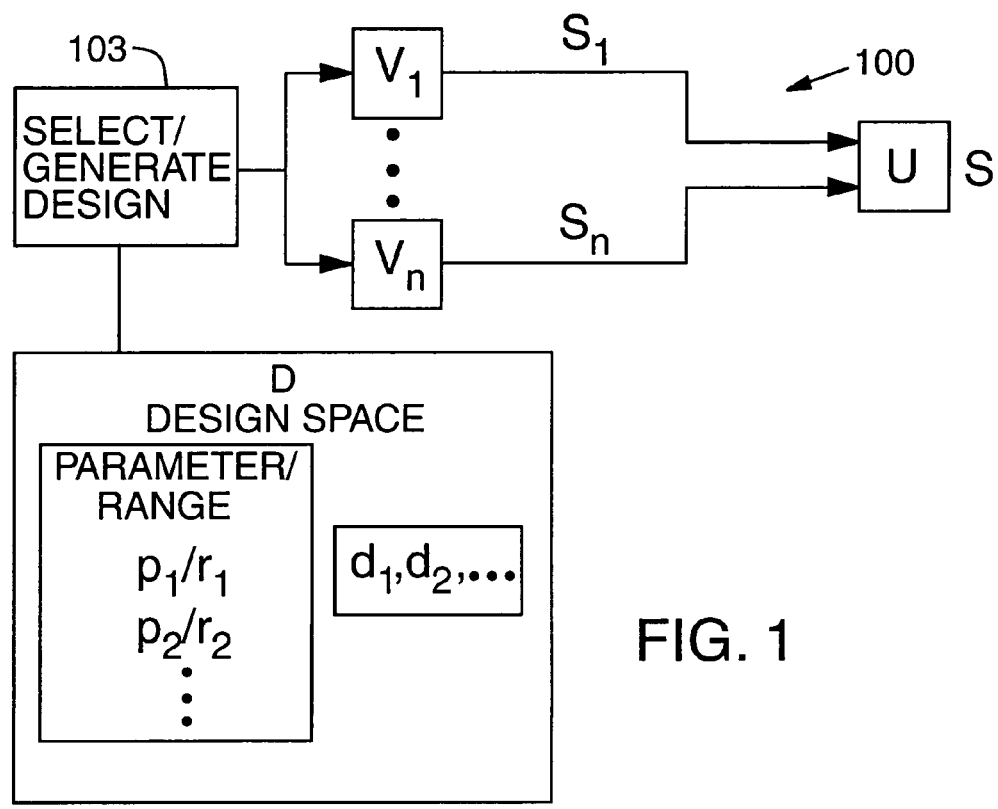
FIG. 1 illustrates a computer program that produces a validity set from a design space.

For convenience, the following list of definitions of terms used herein is provided:

Design Space

A design space is a set of designs for a system.

Discrete Design Parameter

A discrete design parameter is a parameter that at least partially specifies a portion of a design and that assumes a discrete set of values, for example, Boolean values, integer values, sets, graphs, etc. As used herein, a system is specified by discrete parameters.

Programmatic

The term "programmatic" means performed by a program implemented in either software or hardware. The methods described below are implemented in programs stored on a computer readable medium. A computer readable medium is a generic term for memory devices commonly used to store program instructions and data in a computer and for memory devices used to distribute programs (e.g., a CD-ROM).

Component

A component is a part of a system. A system can comprise one or more components.

Component Design

A component design is a design for a component of a system. A component might, itself, be a system that has components.

Composition

A composition is a construction of a system design from component designs.

Hierarchical Design Space

A design space in which each design includes a set of component designs and in which each of the component designs can be a system design.

Term

A Boolean-valued relation (e.g., greater than, less than, equal) between two expressions involving discrete parameters characterizing a design.

Singleton Term

A term involving only parameters corresponding to a single component.

Coupled Term

A term involving parameters corresponding to multiple components.

Common Term

A logical term in a system validity function V( ), expressed in canonical form, that occurs in all AND expressions of the system validity function V( ) and includes only singleton terms. Component parameters appearing only in common terms are referred to as common parameters.

Partial Term

A term in a system validity function V( ) that is not a common term.

Validity Predicate

A Boolean function constructed from Boolean terms. A design is a valid design if and only if a corresponding validity predicate evaluates to TRUE for the parameters of that design.

Validity Filter

A function, defined by a validity predicate, whose input and output are both sets of designs. The output set only contains those designs in the input set for which the validity predicate is TRUE. Also, a function that identifies a design as satisfying a validity predicate.

Product Form Predicate

A predicate which is the conjunction of multiple Boolean expressions, wherein each Boolean expression contains terms that involve the parameters of only one component.

Validity Set

A set of designs obtained by application of a validity filter.

Evaluation Metric

The vector of metrics defining the quality (e.g., performance, cost, size, etc.) of a design.

System Evaluation Metric

An evaluation metric for a system design.

Component Evaluation Metric

An evaluation metric for a component design.

Evaluation Function

A formula or procedure for computing a vector-valued evaluation metric for a given design. An evaluation function can consist of, for example, the evaluation of a formula or the execution of a computer program, or simulation of the execution of a computer program.

System Evaluation Function

An evaluation function that is applied to system designs.

Component Evaluation Function

An evaluation function that is applied to component designs.

Comparison Function

A function that compares evaluation metrics for two or more designs. A comparison function that compares designs A and B generally returns one of four answers: (1) A is better than B; (2) B is better than A; (3) A and B are equally good; (4) neither A nor B can be said to be better than the other.

Correlated Evaluation Function

A component evaluation function is correlated with a system evaluation function if the following is true most of the time, and when it is not the extent to which it is false is generally small. If the component evaluation function indicates that a component B is worse than a component A of the same type, then the system evaluation function will indicate that any system containing B is worse than the same system but with B replaced by A.

Monotonicity

A monotonically non-decreasing function is defined as a function whose value does not decrease for any increase in the value of its arguments. A monotonic decomposition is a system decomposition into components wherein a system quality function is a monotonically non-decreasing function of component parameters.

Pareto Set

A set of all designs such that there is no other design in the design space better than any one of them.

Quality Set

A Pareto set or some acceptable approximation to a Pareto set.

Quality Design

A design that is an element of a quality set.

Quality Filter

A function that computes a quality set from a set of designs, or identifies a design as a quality design.

Abstract Instruction Set Architecture Specification

An Abstract Instruction Set Architecture (ISA) Specification is an abstract specification of a processor design and may include the following:

- an opcode repertoire, possibly structured as operation sets;
- a specification of the I/O format for each opcode;
- a register file specification, including register file types and the number of each type;
- a specification of the desired instruction level parallelism (ILP) constraints, making use of some form of concurrency sets, exclusion sets or a combination of concurrency and exclusion sets, that specifies which sets of operation groups/opcodes can be issued concurrently; and
- other optional architecture parameters, e.g., presence/absence of predication, speculation, etc.

DETAILED DESCRIPTION

The identification of superior designs for a complex system having a large design space can be time-consuming and expensive. The designs of many systems of practical interest are characterized by one or more (typically very many) discrete design parameters. Example of such systems include computer systems and other digital electronic systems. A typical discrete parameter for such systems is memory size because memory contains integer numbers of bits and is frequently restricted to numbers of bits or bytes that are powers of two.

Quality filtering is described below with reference to processor systems such as very long instruction word (VLIW) processor systems and other processor systems as a specific illustrative example. The design of processor systems involves choosing designs for numerous subsystems of the processor system. Because there are many design variables and the evaluation of even a single design can be expensive and time consuming, exploring all possible designs is generally infeasible. Accordingly, validity and quality filtering can reduce the time and money spent on system design. In addition, programmatic quality filtering can replace design selection based on designer "hunches" that do not necessarily discover superior designs. In some cases, VLIW processor design is simplified by decomposing the processor system into subsystems, referred to herein as "components." Designs for the components are validity and quality filtered.

Processor system designs can include a processor, a cache memory, and a systolic array. In some applications, the processor is a VLIW processor that is specified by an abstract ISA specification that includes a data set that contains specifications for predication, speculation, numbers and types of registers, numbers and types of functional units, and literal widths for memory literals, branch literals, and integer data literals. In the examples discussed below in which execution time is selected as a performance criterion, sufficient processor data is provided to permit the simulated execution of an application program on a selected processor design. Cache memory can include a level 1 data cache, a level 1 instruction cache, and a level 2 unified cache. Each of these caches can be specified with parameters for the number of ports, cache size, line size, and associativity. A systolic array can be specified by shape, bandwidth, and mapping direction.

For convenience, a design space (D) is defined as a set of designs (d) for an embedded processor system, a very long instruction word (VLIW) processor system, a cache memory, or other system of interest. The design space D can be limited by design constraints, such as a total substrate area available for a processor or other components, total available power, or other design constraint. Superior designs in the design space D are to be identified and a particular design selected for implementation. Generally a design d of the design space D is evaluated in terms of appropriate performance criteria. For processor systems including embedded processor systems, VLIW processor systems, and components thereof (such as cache memory), two primary performance criteria are cost of the design and execution time of the design. Cost can be measured as an actual manufacturing cost but is conveniently represented as a substrate area required to implement the design. The execution time is a time required for a component of the system of interest to complete a task associated with that component. For example, the execution time associated with a cache memory is the additional execution time required due to the selected cache design.

The execution time is determined by calculating, measuring, or estimating the time required to execute a benchmark application using benchmark data. The selected benchmark application usually is chosen to impose demands on the processor system or components similar to the demands imposed by the intended applications of the processor system.

For the set of designs d of the design space D, the system designer uses an evaluation function E(d) to assess each of the designs d in terms of the chosen performance criteria. In general, if designs are evaluated according to m performance criteria, the evaluation function E(d) maps the designs to an evaluation metric in an m-dimensional space, wherein the m-dimensions correspond to the performance criteria. For evaluation of processor designs in which cost and execution time are the selected performance criteria, the evaluation function E(d) maps a design d to a 2-dimensional time/cost space.

FIG. 1 illustrates a computer program 100 that carries out a programmatic method for selecting a set of potentially valid system designs (a validity set) of a design space D. The design space D is represented as a database listing all possible (valid and invalid) system designs, or, as a database listing system design parameters $p_1, p_2, \ldots$ and respective parameter ranges $r_1, r_2, \ldots$, or a combination thereof. The design space D generally includes some invalid system designs because arbitrary combinations of valid parameter values (i.e., in the ranges $r_1, r_2, \ldots$) can produce system designs that are invalid.

A design input module 103 of the program selects a set of system designs from the design space D by retrieving the set of system designs from the database D or by composing the set by selecting values for the parameters $p_1, p_2, \ldots$ from the database D. The design input component 103 delivers the set of designs or a selected design to validity filters $V_1, \ldots, V_n$ that check the system designs for validity based on respective validity predicates $v_1, \ldots, v_n$. The validity predicates are generally determined manually by a system designer, but can be produced programmatically as well. If a selected system design satisfies an arbitrary validity predicate $v_i$, the validity filter $V_i$ adds the selected design to a validity set $S_1$ and the sets $S_1, \ldots, S_n$ are combined in a validity set S that is a union of the sets $S_1, \ldots, S_n$. (As shown in FIG. 1 and elsewhere herein, "U" denotes a union operator.) A selected design can satisfy one or more or none of the validity filters $V_1, \ldots, V_n$. The validity filters $V_1, \ldots, V_n$ check design validity until all designs from the design space D have been checked. The validity set S then contains all system designs from the design space D that satisfy one or more of the validity predicates $v_1, \ldots, v_n$.

Filtering the design space D can reduce the effort required to select a suitable system design. For example, if the design space D includes 10,000 system designs and there are two validity filters $V_1, V_2$ that each transmit 1,000 designs to the validity set U, at least 8,000 invalid system designs are eliminated from further analysis.

Figure 2:
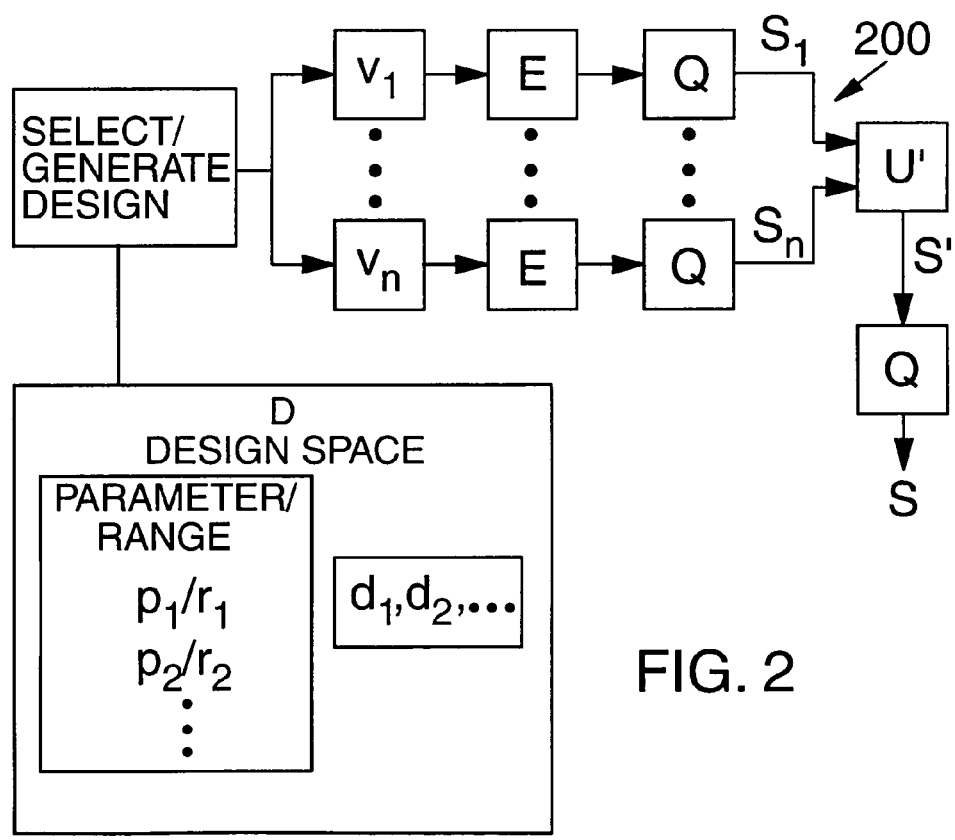
FIG. 2 illustrates a computer program that includes validity filters and quality filters.

FIG. 2 illustrates a computer program 200 that produces a filtered set of system designs that is both validity filtered and quality filtered. System designs that satisfy one or more of the validity predicates $v_1, \ldots, v_n$ are delivered to respective evaluation modules E (or a single evaluation module) that produce a quality metric for each system design based on a common evaluation function. The evaluation metrics are provided to a quality filter Q along with the selected design. The quality filter Q selects system designs satisfying one or more quality criteria (or quality predicates), and these selected designs are added to a quality set S'. Representative quality criteria are, for computer systems, the wafer area required to define associated memory and processing units, and the execution time required to execute a typical application program for which the computer system is intended. Many other quality criteria are possible. For some systems, the quality metric includes both wafer area and execution time and the quality filter adds only Pareto designs to the quality set. Pareto designs are discussed in detail below.

Referring further to FIG. 2, the quality filter Q selects system designs from the quality set S' and produces the set S that also is a quality set. The system designs of the set S all satisfy at least one of the validity predicates $v_1, \ldots, v_n$, and the quality filter Q compares the evaluation metrics of the valid system designs corresponding to the various validity predicates $v_1, \ldots, v_n$. Some designs are removed by this second quality filtering because designs obtained by satisfying the various validity predicates. $v_1, \ldots, v_n$ can eclipse each other.

Generally, some of the designs in the quality sets can be invalid. However, in many cases, a system validity predicate can be represented as a sum (a logical OR) of the validity predicates $v_1, \ldots, v_n$, and, in such cases, all designs of the quality sets are valid. In addition, the system validity predicate V( ) and the validity predicates $v_1, \ldots, v_n$ can be configured so that a system design that is determined to be valid by the validity filters $V_1, \ldots, V_n$ is evaluated and added to the quality set S' only once. Such an arrangement of validity filters is discussed below in terms of a specific example.

For a system that includes a processor and a memory, an example validity function V( ) is:

V( )=((instrSize<=64) & (n_p<=n_m) & (intLitSize<=32))II ((instrSize <=64) & (n_p=n_m) & (memLitSize<=32)), wherein instrSize is an instruction length, n_p is a number of processor ports, n_m is a number of memory ports, and memLitSize is a length of a memory literal, and "&" denotes a logical AND operation and "II" denotes a logical OR operation. The validity function V( ) can be decomposed into three mutually exclusive logical terms as follows. (Mutually exclusive logical terms are defined as logical terms only one of which can be true for arbitrary values of parameters of the terms.) The decomposition of the validity function V( ) uses the fact that a logical expression of the form C=A OR B can be represented as the disjunction (logical OR) of three mutually exclusive AND terms A AND B, A AND (NOT B), and (NOT A) AND B, such that C=(A AND B) OR (A AND (NOT B)) OR ((NOT A) AND B). Accordingly, the validity function V( ) can be expressed as:

V( )=$v_1$ OR $v_2$RV$_3$, wherein $v_1$=((instrSize<=64) & (n_p<=n_m) & (intLitSize<=32)) &

(instrSize<=64) & (n_p=n_m) & (memLitSize<=32), which simplifies to (instrSize<=64) & (n_p=n_m) & (memLitSize<=32) & (intLitSize<=32);

$v_2$=((instrSize>64) OR (n_p>n_m) OR (intLitSize>32)) &

(instrSize<=64) & (n_p=n_m) & (memLitSize<=32), which simplifies to $v_2$=(instrSize<=64) & (n_p=n_m) & (memLitSize <=32) & (intLitSize)>32); and $V_3$=((instrsize>64) OR (n_p<>n_m) OR (memLitSize>32))

(instrSize<=64) & (n_p<=n_m) & (intLitSize<=32), which simplifies to $v_3$=(instrsize<=64) & (intLitSize<=32) & ((n_p<n_m) II (n_p<n_m) & (memLitSize 32)).

Figure 3:
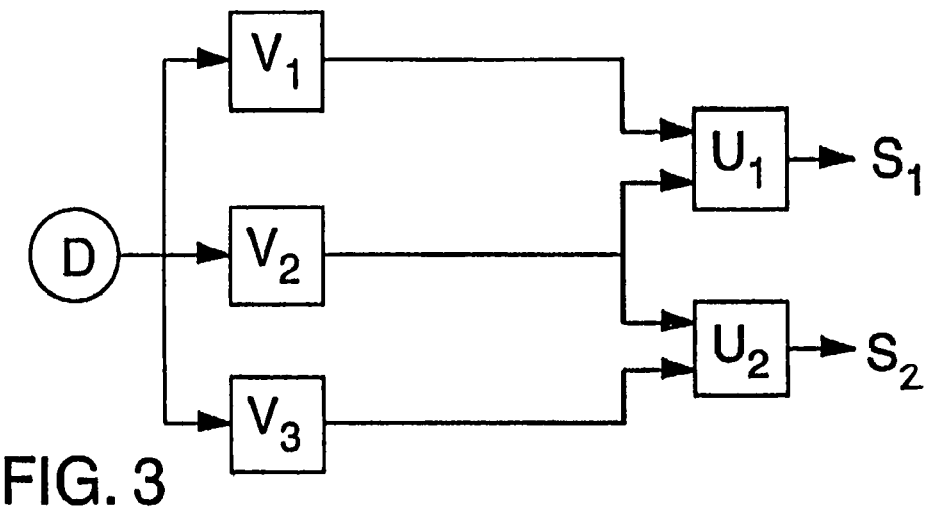
FIG. 3 illustrates a computer program that uses mutually exclusive validity predicates to produce two validity sets.

FIG. 3 illustrates validity filtering using mutually exclusive validity predicates $v_1$, $v_2$, $v_3$. As in the examples of FIGS. 1–2, a design input module selects or prepares a system design or a set of system designs D and provides the designs to validity filters $V_1$, $V_2$, $V_3$ that perform validity filtering based on the mutually exclusive validity predicates $v_1$, $v_2$, $v_3$ such as those discussed above. With such validity predicates, a valid system is identified as valid by only one of the validity filters $V_1$, $V_2$, $V_3$ and is added to a set of potentially valid designs only once. In addition, the designs satisfying the mutually exclusive validity predicates $v_1$, $v_2$, $v_3$ can be added to validity sets $S_1$, $S_2$, wherein the validity sets $S_1$, $S_2$ correspond to the original (nonexclusive) validity predicates. In FIG. 3, the validity filters $V_1$, $V_2$, $V_3$ can be followed by evaluation components and quality filters prior to forming the validity sets $S_1$, $S_2$.

Figure 4:
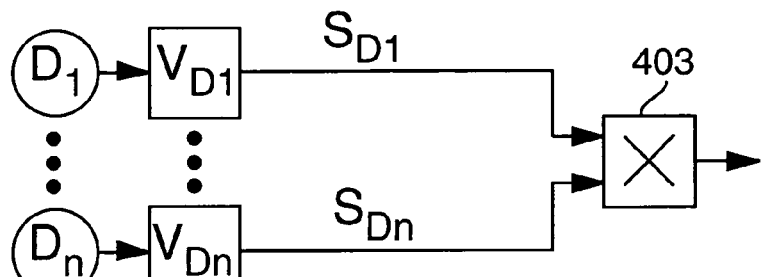
FIG. 4 illustrates a computer program that includes component validity filters that are applied to form component validity sets that are combined to produce a system validity set.
Figure 5:
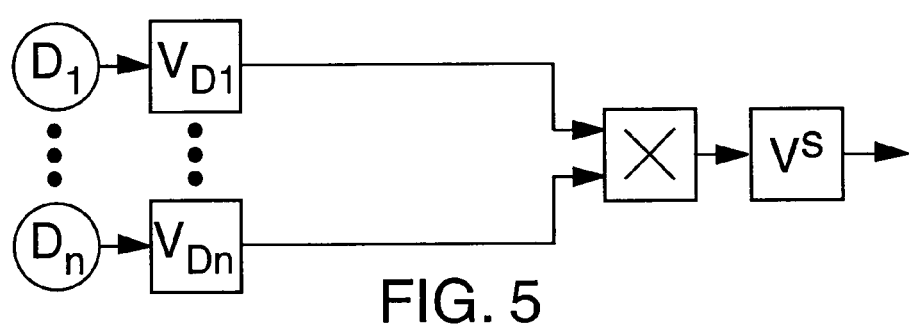
FIG. 5 illustrates a computer program that includes component validity filters that produce component validity sets that are combined to form a first system validity set to which a system validity filter is applied to produce a second system validity set.

Many practical systems are hierarchical and validity filtering and quality filtering can be carried on component design spaces instead of, or in addition to, filtering the system design space directly. FIG. 4 illustrates a computer program that programmatically performs validity filtering on a hierarchical system. The design space includes component design spaces $D_1, \ldots, D_n$ corresponding to the system components. A component design input module provides component designs or a set of component designs to respective component validity filters $V_{D1}, \ldots, V_{Dn}$. The component validity filters $V_{D1}, \ldots, V_{Dn}$ determine whether a component design is valid based on respective component validity predicates $v_{D1}, \ldots, v_{Dn}$. The component validity filters $V_{D1}, \ldots, V_{Dn}$ deliver component validity sets $S_{D1}, \ldots, S_{Dn}$ to a system composition module 403 that combines the component designs to form system designs. The system composition module 403 forms all combinations of the various component designs in the component validity sets, i.e., forms the Cartesian product of the component validity sets. These system designs satisfy the component validity predicates $v_{D1}, \ldots, v_{Dn}$ but are not necessarily valid system designs. If the system has a validity predicate V( ) that is a product (a logical AND) of the component validity predicates $v_{D1}, \ldots, v_{Dn}$, then these system designs are all valid. Otherwise, an additional system validity filter $V^s$ can be provided, as shown in FIG. 5.

Figure 6:
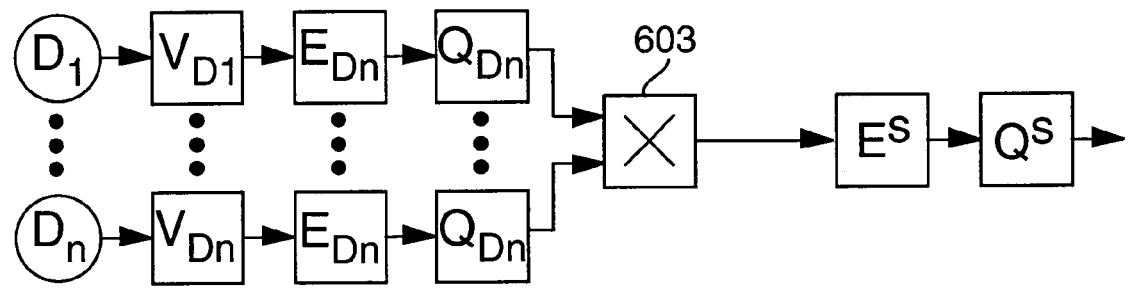
FIG. 6 illustrates a computer program that performs validity and quality filtering on component design spaces and produces a set of system designs that is then filtered by a system quality filter.

FIG. 6 illustrates a computer program that performs programmatic validity and quality filtering of component design spaces. A component design input module (similar to that shown in FIG. 1) selects or generates component designs or sets of designs for components $D_1, \ldots, D_n$ and delivers the designs to respective validity filters $V_{D1}, \ldots, V_{Dn}$ that deliver component validity sets to respective evaluation modules $E_{D1}, \ldots, E_{Dn}$ The evaluation modules $E_{D1}, \ldots, E_{Dn}$ evaluate the component designs based on predetermined criteria according to respective evaluation functions $E_{D1}( ), \ldots, E_{Dn}( )$, producing component evaluation metrics. Component quality filters $Q_{D1}, \ldots, Q_{Dn}$ receive the component designs and associated component evaluation metrics and implement component comparison functions. The component designs, after selection by the component quality filters $Q_{D1}, \ldots, Q_{Dn}$ (i.e., preparation of component quality sets), are delivered to a composition module 603 that produces a set of system designs that corresponds to a Cartesian product of the component quality sets. These system designs are then communicated to a system evaluation module $E^s$ and a system quality filter $Q^s$ that produce a validity filtered quality set.

Figure 7:
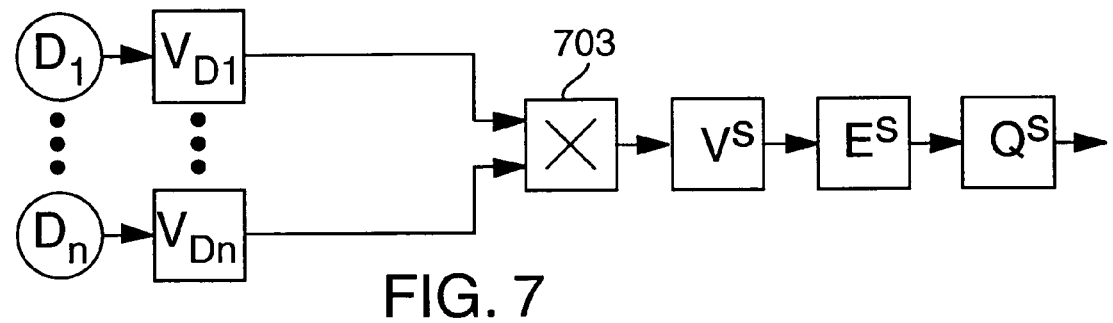
FIG. 7 illustrates a computer program that performs validity filtering on component design spaces to produce component validity sets, combines the component validity sets to produce a system validity set, and then applies system validity and quality filters.

FIG. 7 illustrates a programmatic method of obtaining a set of designs that is both validity filtered and quality filtered. Respective validity filters $V_{D1}, \ldots, V_{Dn}$ produce respective component validity sets for the components $D_1, \ldots, D_n$. A system composer 703 forms a Cartesian product of the component validity sets, producing a set of system designs. The designs of this set are not necessarily valid, even though the constituent component designs are valid. A system validity filter $V^s$, a system evaluation function $E^s$, and a system quality filter $Q^s$ receive the set of system designs and produce a filtered set of system designs.

In the examples of FIGS. 4–7, each of the component design spaces $D_1, \ldots, D_n$ is validity filtered, but such validity filtering can be omitted if all designs from a design space are known to be valid.

Figure 8:
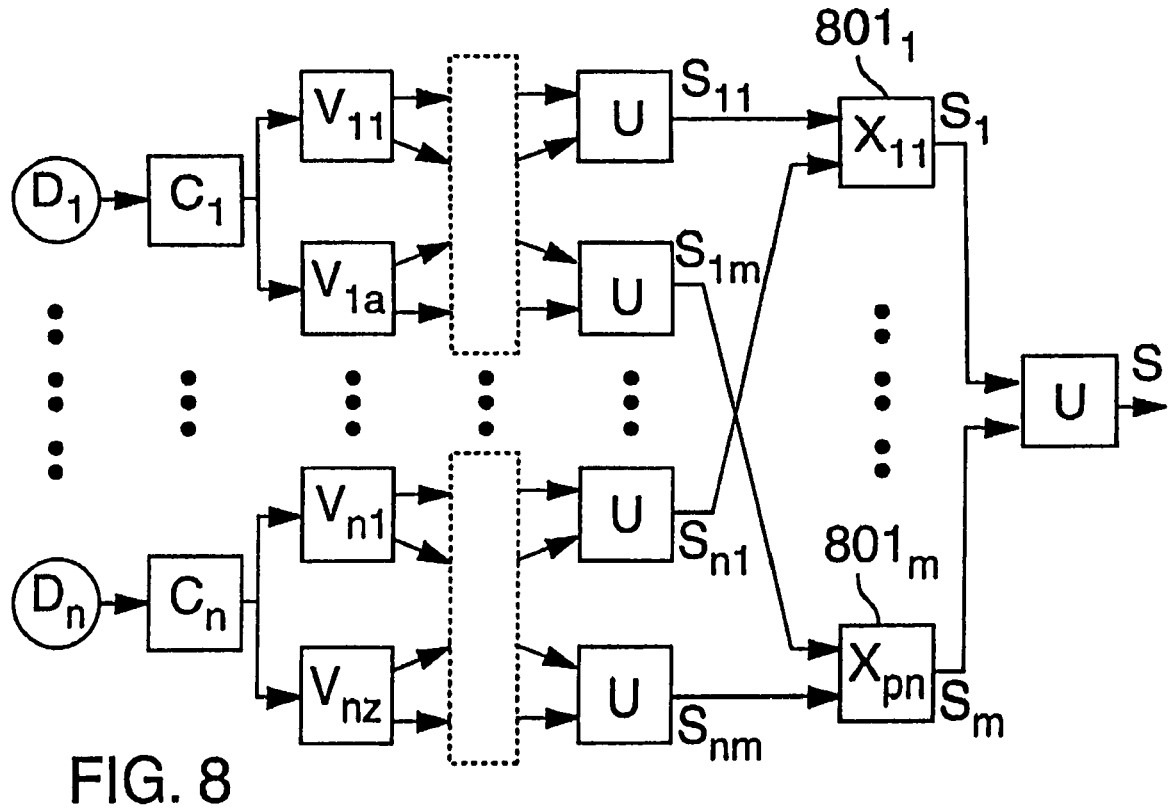
FIG. 8 illustrates a computer program that produces a validity set from component design spaces.
Figure 9:
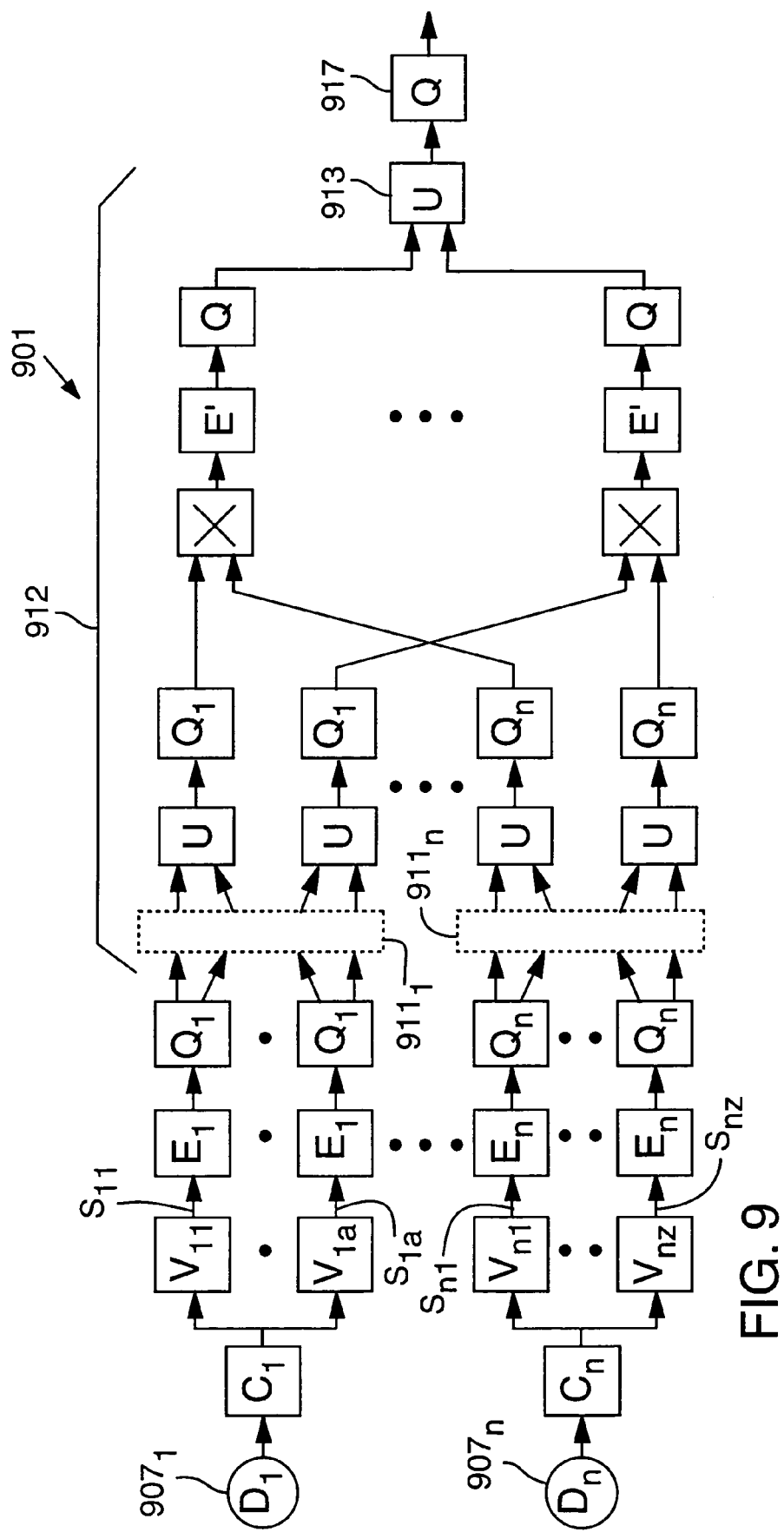
FIG. 9 illustrates a computer program that produces a quality set from component design spaces.

FIGS. 8–9 illustrate computer programs that perform validity filtering or quality filtering (or both) on system designs composed of component designs $D_1, \ldots, D_n$. In FIG. 8, respective common component validity filters $C_1, \ldots, C_n$ prepare component validity sets for respective component designs $D_1, \ldots, D_n$. The component validity sets are then filtered by partial component validity filters defined by partial component validity predicates $(V_1, \ldots, V_{1a}), \ldots, (V_{n1}, \ldots, V_{nz})$, respectively. As noted previously, for any component design space for which all designs are known to be valid, validity filtering can be omitted and if all system designs are known to be valid, validity filtering can be completely omitted. The resulting partial component validity sets are combined to form component validity sets $S_{11}, \ldots, S_{nm}$. In steps $801_1, \ldots, 801_m$ Cartesian products of these sets form system design sets $S_1, \ldots, S_m$ that are combined to form a system validity set S.

FIG. 9 illustrates a design selection program 901 that performs both validity filtering in a manner similar to that of FIG. 8 with additional quality filtering on both system designs and component designs. The design selection program 901 includes common component validity filters $C_1, \ldots, C_n$ for respective components $D_1, \ldots, D_n$. The program 901 receives component designs, design specifications, or sets of designs $D_1, \ldots, D_n$ for system components based on a system decomposition. Generally, the program 901 uses the component design specifications $D_1, \ldots, D_n$ to generate an exhaustive set of component designs but can receive component designs previously generated. The common component validity filters $C_1, \ldots, C_n$ prepare component validity sets and discard component designs determined to be invalid.

While the common component validity filters $C_1 \ldots, C_n$ can identify invalid component designs, not all combinations of component designs from the common component validity sets result in valid system designs, and the program 901 splits component design spaces into disjoint predicated design spaces $911_1, \ldots, 911_m$ so that only valid combinations of component designs are considered. A system composer 912 generates sets of system designs based on the valid component designs and the valid combinations of component designs. In a final combining step 913 these designs are combined to form a complete set of system designs. A quality filter 917 then produces a quality set (such as a comprehensive Pareto set) and associated evaluation metrics.

One or more of the common component validity filters $C_1, \ldots C_n$ can include a Boolean system validity function V( ). The system validity function V( ) is conveniently expressed in a canonical OR-AND form to comprise an OR of one or more terms, each of the terms comprising an AND of one or more terms, wherein the terms within an AND are the smallest terms in the validity function V( ) that evaluate to Boolean values. Because any Boolean function can be reduced to canonical OR-AND form, consideration of the system validity function V( ) in a canonical form does not limit the generality of the system validity function V( ). As an example, a system having components that include a processor and a memory can be specified by processor parameters instrSize, intLitSze and memLitSize, corresponding to instruction size, integer literal size, and memory literal size, respectively. In addition, the processor has a number n_p data access ports and the memory has a number n_m memory ports. A representative system validity function V( ) for this system is, in canonical form:

V( )=((instrSize<=64) & (n_p<=n_m) & intLitSize<=32) OR ((instrSize<=64) & (n_p=n_m)&memLitSize<=32).
This validity function includes an OR of the following two AND expressions:
(instrSize<=64) & (n_p<=n_m) & intLitSize<=32; and
(instrSize<=64) & (n_p=n_m) & memLitSize<=32.

The terms in this validity function are: (instrSize<=64), (n_p<=n_m), (intLitSize<=32) and (memLitSize<=32). The term (instrSize<=64) is a singleton term that appears in both AND expressions and is a parameter of the processor only and is therefore a common term. The remaining terms are partial terms.

Common terms in the validity function, such as (instrSize<=64), are evaluated with reference to a component design for a single component. The corresponding common component validity filter (one of the common component validity filters $C_1, \ldots, C_n$) evaluates the term (instrSize<=64) based on the processor design only, without consideration of the memory design. The terms (intLitSize<=32) and (memLitSize<=32) appear to qualify as common terms but do not appear in both AND expressions. Because (intLitSize<=32) does not appear in both AND expressions, a component design that does not satisfy the term (intLitSize<=32) can be an element of a validity set. The result of an evaluation of a validity predicate that includes a common term is TRUE (valid) only if the common term is also TRUE (valid). Consequently, component designs that do not satisfy a common term are not part of any valid system design.

Elimination of invalid component designs simplifies system design. For example, if there are 100 designs each for the processor and the memory, and the common term (instrSize<=64) is satisfied by only 40 of the 100 designs, and 60 processor designs are excluded by component validity filtering.

Partial validity filters $V_{11}, \ldots, V_{nz}$ receive component validity sets produced by the respective common component validity filters $C_1, \ldots, C_n$ and use partial terms in the system validity function to identify and eliminate invalid component combinations, and to ensure that designs for different components match to reduce evaluation time and expense wasted on system designs known to be invalid. The partial validity filters $V_1, \ldots, V_{nz}$ can use expansions of the partial terms of the system validity function V( ). The expansion can produce singleton terms or additional coupled terms that can be expanded as well. Such expansion continues until the system validity function has only singleton terms and common terms, and no coupled terms.

The coupled terms are expanded to obtain all permitted values for the coupled terms, and to replace the coupled terms with a conjunction of terms corresponding to each of the permitted values. One term requires the expansion parameter to take on a particular value and the other term is a term with the expansion parameter set to the same value. As an example, the coupled term (n_p<=n_m) can be expanded using n_p as an expansion parameter for a design space of processors having one or two data access ports. The substitutions n_p=1 and n_p=2 are made in the validity function, producing a logically equivalent validity function without coupled terms:
V( )=(instr_siz<=64) & (((n_p=1) & (n_m>=1) & (intLitSize<=32)) OR
((n_p=2) & (n_m>=2) & (intLitSize<=32)) &
((n_p=1) & (n_m=1) & (memLitSize<=32))&
((n_p=2) & (n_m=2) & (memLitSize<=32))

In this example, a series of equality constraints are produced with respect to the expanded coupled term. Other expansions of coupled terms are possible, but every permitted value that the coupled term can assume for designs in the component design space should satisfy at least one of the expanded terms. For example, the term n_p<=n_m can be expanded to include n_p<=1 and n_p>=2. In general, expansions that reduce or eliminate coupled terms simplify design evaluation.

The expanded form of the system validity function V( ) is used by the partial validity splitters $V_{11} \ldots, V_{nz}$ to determine a set of partial validity predicates for the component design spaces. The partial validity predicates are formed by scanning the AND terms in the system validity function V( ) and collecting all unique combinations of terms involving a component. In the above example, the partial validity predicates for the memory are:
(n__m>=1),
(n__m>=2),
(n__m=1),
(n__m=2), and the partial validity predicates for the processor are:
n__p=1 & intLitSize<=32,
n__p=2 & intLitSize<=32,
n__p=1 & memLitSize<=32,
n__p=2 & memLitSize<=32.

Predicated component design spaces $911_1, \ldots, 911n$ can be formed based on the partial validity predicates. In the example discussed previously, the valid designs identified by the common component validity filters $C_1, \ldots, C_n$ includes the 40 processor designs that satisfy (instrSize<=64). Four smaller predicated design spaces can be formed, each satisfying one of the four processor partial validity predicates listed above. If a processor design can satisfy both (intLitSize<=32) and a (memLitSize<=32), then the predicated design spaces are not disjoint and a design can belong to more than one predicated design space.

The system composer 912 combines the component designs from the predicated design spaces $911_1, \ldots, 911_n$ to produce system designs that are combined in a union operation 913. The system composer 912 iterates over the AND expressions in the expanded system validity function V( ) and splits the AND expression into sub-expressions each involving parameters from a particular component. Each sub-expression corresponds to a partial validity predicate and one of the predicated design spaces $911_1, \ldots, 911_n$. The system composer 912 picks corresponding predicated design spaces, one for each of the components, and takes the Cartesian product of the predicated design spaces $911_1, \ldots, 911_n$, producing a set of system designs.

After the system composer 913 produces the set of system designs, a system quality filter 917 receives the system validity set and produces, for example, a Pareto curve or a Pareto set for the system. The quality filter 917 receives system designs after several stages of validity filtering and thus, identifies quality designs from valid designs. Without prior validity filtering, the quality filter can identity invalid quality designs without identifying any valid designs.

Figure 10:
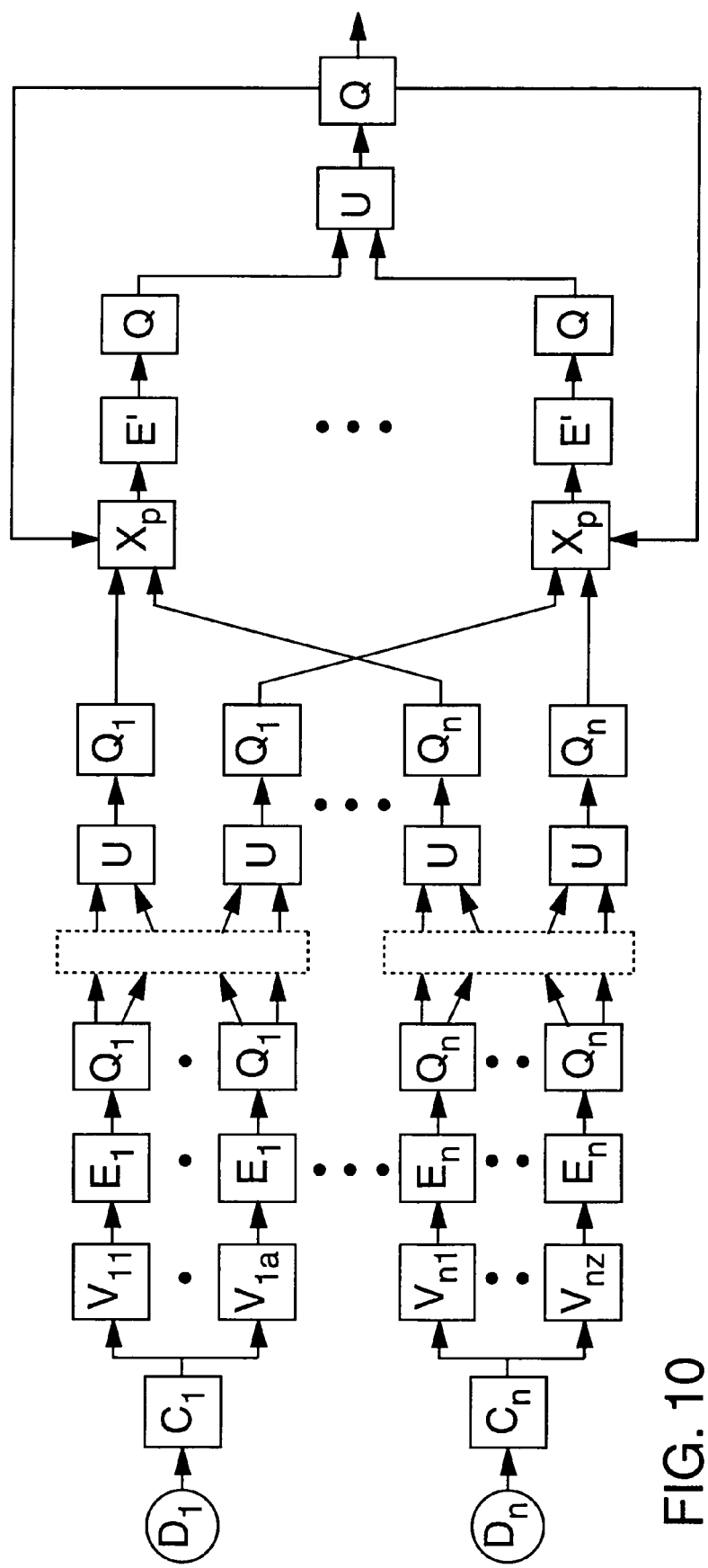
FIG. 10 illustrates a computer program that produces a quality set from component design spaces.

FIG. 10 illustrates a method similar to that of FIG. 9 that is typically more efficient. In FIG. 10, full Cartesian products of component quality sets are not constructed. Instead, partial Cartesian products (denoted as "$X_p$") are formed, eliminating some system designs from further consideration. Such system designs are eliminated by considering system designs that are currently members of the system quality set and by finding lower bounds on the evaluation metrics of the eliminated systems. This procedure is applicable when the decomposition is monotonic.

Prior to forming the partial Cartesian products, the component quality filters $Q_1, \ldots, Q_n$ find the lowest values for each of the evaluation metric of the component quality sets. As the Cartesian product $X_p$ is formed, full system designs are produced by combining component designs. After a subset of component designs is selected, the respective evaluation metrics are used in conjunction with the best values of the evaluation metrics of the unselected components to obtain (using the monotonicity property) lower bounds on the evaluation metrics of any system design that includes selected components. The lower bound is then compared with the system designs in the partially completed system quality set. If the lower bound is eclipsed by any system in this set, then the partial Cartesian product module does not combine these components to produce system designs because such designs are known to be eclipsed.

Other combinations of validity filtering and quality filtering are obtained by combining the methods illustrated in FIGS. 1–10 and noting that components of a system are frequently decomposable into (sub)components.

Quality filtering generally produces a Pareto set or an approximation to a Pareto set. One or more evaluation functions E(d) produce evaluation metrics that permit comparison of various designs. For convenience, quality filtering is further described below with respect to a two-dimensional quality metric (such as cost and execution time for a processor system), and with reference to processor system design.

Figure 11:
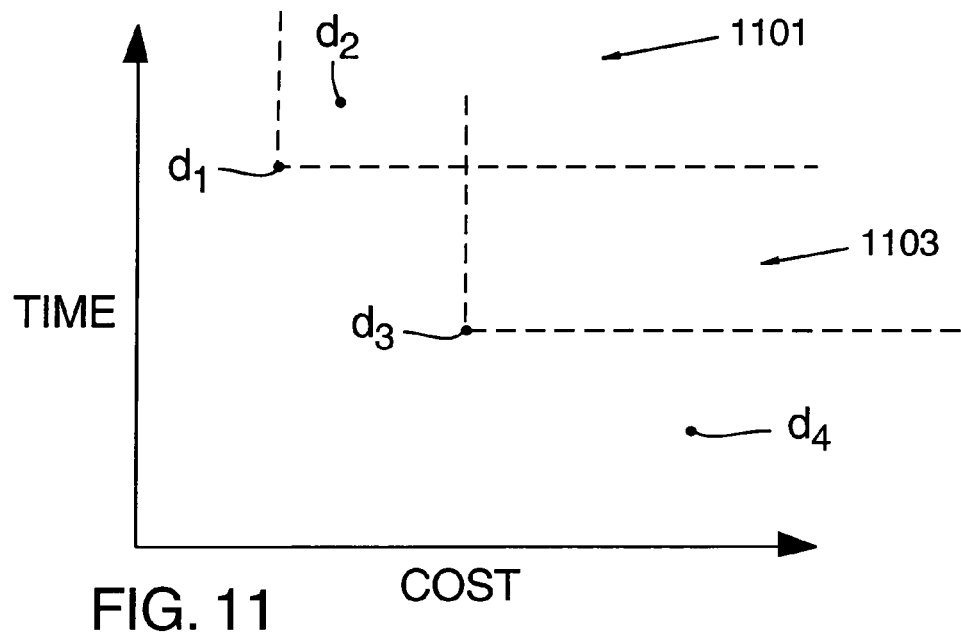
FIG. 11 shows a mapping of designs into a time/cost plane.

FIG. 11 shows a mapping of designs $d_1, d_2, \ldots, d_n$ into the two dimensional time/cost space. While the mapping of FIG. 11 appears straightforward, the actual computation of E(d) for each of the designs $d_1, d_2, \ldots, d_n$ can be expensive and time-consuming, requiring simulation of each the designs and evaluation of the design time based on the benchmark application. Because the computation of E(d) is expensive and slow, the design space DS is generally not fully explored (i.e., for some designs E(d) is not evaluated) and a design is selected without evaluating all the available designs. Reducing the number of designs d to be evaluated (by validity or quality filtering or a combination thereof) significantly reduces the difficulty of identifying a preferred design.

The evaluation function E(d) permits determination of superior designs by inspecting the mapping of the designs to the m-dimensional performance criteria space. If the evaluation function E(d) maps designs $d_i$, $d_k$ to respective m-dimensional coordinates $(e^i_0, \ldots, e^i_{m-1})$, $(e^k_0, e^k_{m-1})$, then the design $d_k$ is said to "eclipse" the design $d_i$ if the design $d_k$ is superior or equivalent to $d_i$ in at least one evaluation criterion (and no worse in all other criteria), that is, if $e^k_j < e^i_j$ for at least one value of j and $e^k_j \leq e^i_j$ for all other values. The m-dimensional coordinate associated with a design d is referred to as a "design point," or simply as a design. Because the coordinates $e_j$ correspond to cost, time, or other performance criteria that are preferably minimized, the design $d_k$ that eclipses the design $d_i$ is either cheaper, quicker, or in some other fashion superior to the design $d_i$. In some cases, some (or all) of the coordinates $e_j$ of competing designs are equal. If $e^k_j \leq e^i_j$ for all $1 \leq j \leq m$, the design $d_k$ is said to "weakly" eclipse the design $d_i$ (i.e., the design $d_k$ is not inferior to the design $d_i$).

In FIG. 11, the design $d_1$ is shown along with an eclipsing region 1101 of the design $d_1$. The design $d_2$ is within the eclipsing region 1101, and is eclipsed by the design $d_2$. As is apparent from FIG. 11, the design $d_1$ has both a lower cost and a shorter execution time and is therefore superior to design $d_2$. Referring to the design $d_3$, an eclipsing region 1103 of the design $d_3$ is illustrated. The eclipsing region of any design $d_i$ is defined as a region in the design space for which coordinate values $e_j$ are greater than the coordinate values $e^1_j$ of the design $d_1$. In FIG. 11, the eclipsing regions 1101, 1103 are quarter planes extending in the positive time and cost directions.

A goal of processor system design or processor subsystem design (for example, design of a cache memory) is to identify designs with low execution times and costs, i.e., designs that eclipse other designs. A design $d_p$ is referred to as a "Pareto" design if it is not eclipsed by any other design. A comprehensive Pareto set is defined as the set $P_p$ of all the Pareto designs $d_p$. For some systems, the evaluation function E(d) maps several designs to the same coordinates. A Pareto set $P_{sp}$ is a subset of the comprehensive Pareto set $P_p$ that includes at least one of the Pareto designs that have the same coordinates. The eclipsing region of a Pareto set is a union of all the eclipsing regions of the Pareto designs. All designs that fall within the eclipsed region of a Pareto set $P_{sp}$ are eclipsed by one or more designs in the Pareto set $P_{sp}$. A Pareto surface (a curve in a 2-dimensional space) partitions the eclipsing region of a Pareto set from the rest of the m-dimensional space. For the 2-dimensional mapping of FIG. 11, the Pareto surface is a 2-dimensional curve defined by a union of all the eclipsing regions (quarter planes). Thus, the Pareto curve is a set of alternating horizontal and vertical line segments connecting the coordinates of the Pareto designs.

A quality set can also be an approximation to the Pareto set. For example, the evaluation metrics can be calculated with reduced accuracy to simplify the evaluation function. In this case, it is difficult to determine if designs are Pareto designs. Designs that have evaluation metrics that are equal within a range dependent on the inaccuracy in the computation of the evaluation metrics appear equivalent and can be retained in a quality set. In other cases, increased design freedom can be achieved by adding known non-Pareto designs to a quality set. The additional designs are generally close to Pareto designs.

Given a Pareto curve or a comprehensive Pareto set, a design can be selected programmatically to achieve a predetermined cost or time, or combination of cost and time. Using the Pareto curve (or the comprehensive Pareto set), superior designs are not overlooked. However, construction of the Pareto curve and the comprehensive Pareto set by exhaustively evaluating all possible designs is generally infeasible due to the large number of design variables available as well as the complexity of evaluating a particular design. As shown in, for example, FIGS. 4-8, a processor system or other system of interest can be divided into components and component design spaces can be quality filtered (i.e., Pareto filtered) to produce component quality sets that are component Pareto sets. Combining the component Pareto curves or sets constructs a comprehensive Pareto curve or Pareto set for the system. For example, a system design d is a composition of component designs $d^1$, $d^2, \ldots, d^n$ and a set of system designs is obtained from the Cartesian product of sets of component designs, i.e., the set of systems designs is the set of all combinations of the component designs. The program can also determine the validity of a component design or a combination of component designs, as described previously.

If the cost and execution time (or other selected performance criteria) of a system are monotonically non-decreasing functions, replacing a component with a cheaper (faster) component makes the system cheaper (faster). In this case, the comprehensive set of designs obtained from the component Pareto sets can include some non-Pareto designs but includes all the designs of the comprehensive Pareto set. If cost and execution time are generally, but not always, monotonically non-decreasing functions, the comprehensive set of designs obtained from the component Pareto sets may contain non-Pareto designs and may lack some Pareto designs. However, the designs included in this comprehensive set can approximate the Pareto designs, and a near-Pareto design can be selected from this set. Such a set of designs is also a quality set.

The evaluation of a design d depends on the manner in which the performance criteria for the components are combined. For a sequential system, the total value of a selected performance criterion is the sum of the corresponding values for the components. An example of such a system is a system that combines a processor and a cache memory. In such a system, the processor is either busy or waiting for the cache and the total execution time is the sum of the times associated with the processor and the cache. The total cost is the sum of the costs of the components. In a parallel system, all (or many) components of the system are busy simultaneously, and the execution time is the maximum of the execution times for each of the components while the cost is the sum of the component costs. In many systems, no such simple evaluation of system designs based on component designs is possible. For some such systems, system evaluation is individually performed for each system design.

System components can be independent in that the components do not interact with respect to cost or execution time. For such a decomposition, a single Pareto curve (or comprehensive Pareto set) for each of the components is sufficient for preparation of a Pareto curve or a comprehensive Pareto set for the system. In other cases, the components interact and one or more Pareto curves for each component can be necessary. For example, component of systems having validity predicates that contain one or more coupled terms interact and consideration must be given to valid combinations as all combinations of valid components are not valid.

An example system having interacting components is a processor system that includes a processor and a cache that communicate with n ports. For this system, component Paretos are prepared for processors and caches having various numbers n of ports. A combined Pareto is obtained by combining processor and cache Paretos having the same number of ports. Because the processor and cache are matched with respect to the number of ports, the designs of the combined Pareto curve or Pareto set correspond to actual system designs. Interactions such as this affect the validity of a system design that is a combination of component designs.

In some cases, the evaluation function E(d) is only an approximation. For such cases, some non-Pareto designs can be included in a quality set because of the uncertainty in E(d). If a bound on the inaccuracy of E(d) is known, then some designs obtained by combining component designs from the component Pareto sets can be eliminated by showing that these designs have higher costs or longer execution times than some other designs. Such designs can be excluded from the comprehensive Pareto set.

In some systems, the cost, execution time, or other performance criteria of one system component depends upon one or more features of another system component. For example, the number of stall cycles caused by a miss in a first level cache depends on the number of misses in the first level cache and the miss penalty of the first level cache. The miss penalty of the first level cache depends on the time required to access a second level cache or main memory. This access time is generally known only when first level cache and a second level cache designs are combined.

The comprehensive Pareto set produced by combining component Pareto sets can also serve as a component Pareto set for a higher level system. For example, the comprehensive Pareto set for a cache memory obtained by combining component designs for a first level cache and a second level cache not only permits selection of a Pareto cache design, but serves as a component Pareto set for a processor system that includes such a cache memory as a component.

Figure 12:
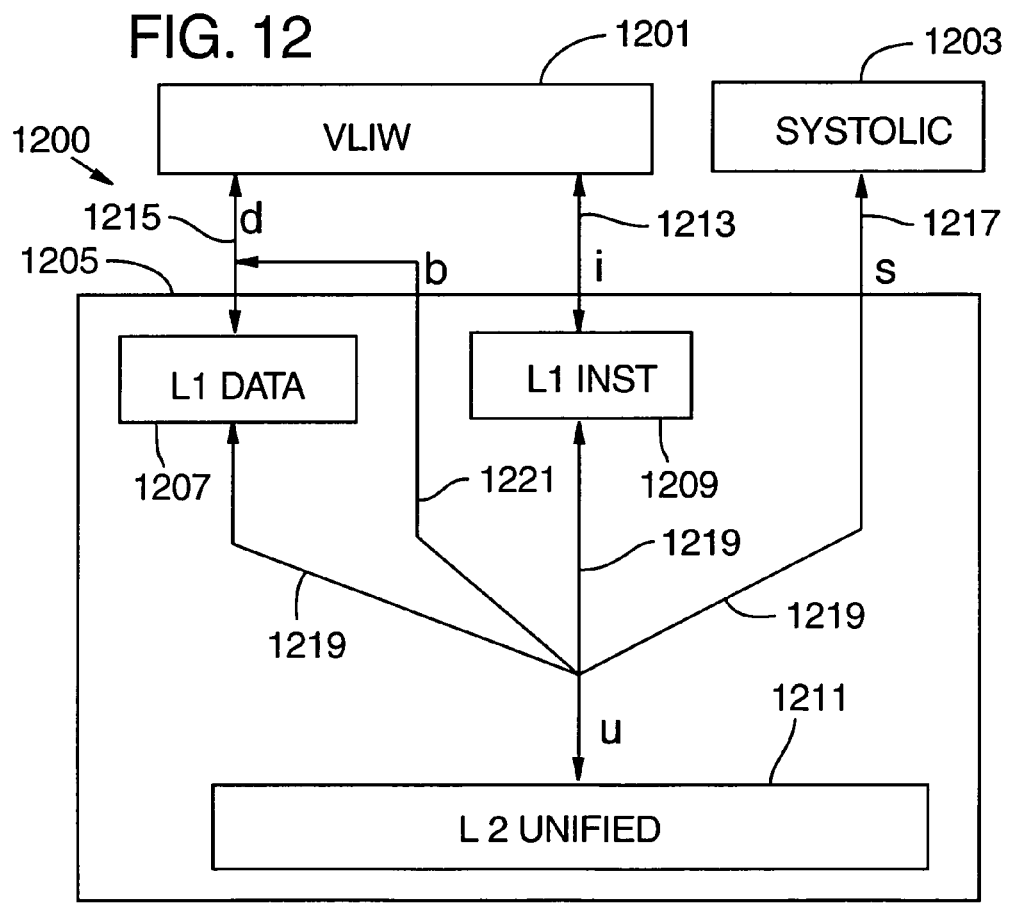
FIG. 12 is a block diagram of a processor system that includes a cache memory, a VLIW processor, and a systolic array.

FIG. 12 is a block diagram of a processor system 1200 used to illustrate processor system design and cache memory design using component Pareto curves or component Pareto sets as described above. The processor system 1200 includes a very long instruction word (VLIW) processor 1201, a systolic array 1203, and a cache memory 1205. The cache memory 1205 is a so-called "split" cache and includes a first level cache L1 that has an instruction cache (i-cache) 1209 and a data cache (d-cache) 1207, and a second level cache L2 comprising a unified cache (u-cache) 1211. (The i-cache 1209, d-cache 1207, and the u-cache 1211 are referred to below as "cache components.") The i-cache 1209 communicates with the processor 1201 via an instruction port 1213; the d-cache 1207 communicates with the VLIW processor 1201 via one or more data ports 1215. The u-cache 1211 communicates with the systolic array 1203 via one or more systolic ports 1217. The u-cache 1211 also includes one or more u-cache ports 1219 for communication with the i-cache 1207 and the d-cache 1209 and can include a bypass port 1221 for communicating directly with the processor 1201. If the bypass port 1221 is enabled, the number of u-cache ports 1219 is the maximum of the number of data ports 1215 and the number of systolic ports 1217. If the bypass port 1221 is disabled, the maximum number of u-cache ports 1219 is the maximum of 1 and the number of the systolic ports 1217.

The i-cache 1209 provides storage for instructions for the VLIW processor 1201; if the i-cache 1209 does not contain an instruction requested by the VLIW processor 1201, then the i-cache 1209 attempts to retrieve the instruction from the u-cache 1211. Similarly, if the d-cache 1207 contains data requested by the VLIW processor 1201, the data is retrieved directly from the d-cache 1207. If not, then the d-cache 1207 attempts to retrieve the data from the u-cache 1211. If the requested data or instruction is not found in the u-cache 1211, then the u-cache 1211 requests the data from conventional memory (RAM or ROM).

The processor 1200 can be considered to be a system formed of three components, the VLIW processor 1201, the systolic processor 1203, and the cache 1205. Each of these components has an associated design space, and a processor design space can be quality filtered and validity filtered as shown in FIGS. 4–9. In addition, the cache 1205 can be considered to be a system formed of three components, the d-cache 1207, the i-cache 1209, and the u-cache 1211. Thus, the cache 1205 is a component of a system and a system formed of components and the design space of the processor 1200 is a hierarchical design space of at least two levels.

As a first example of quality filtering using component Pareto curves or component Pareto sets, the design of the cache memory 1205 is illustrated using component Pareto curves for the i-cache 1209, d-cache 1207, and u-cache 1211. As discussed above, cost and execution time are the selected performance criteria. This and other examples are described using Pareto curves to graphically represent the quality sets, but either Pareto curves or Pareto sets can be used. In addition, Pareto curves are generally indicated as smooth curves connecting the Pareto design points.

RAM and ROM can also be included in the design selection process. The design of the cache memory 1205 includes selection of total cache memory size (the sum of the memory sizes for the cache components, i.e., the i-cache 1209, d-cache 1207, and u-cache 1211), the allocation of memory to each of the components, and other parameters discussed below. To evaluate the designs (i.e., compute E(d)), a representative design for the VLIW processor 1201 is selected and the execution time is based upon the execution time of a benchmark application program (GHOSTSCRIPT) on a predetermined input data file. GHOSTSCRIPT is a widely available application program that converts document files from a POSTSCRIPT format into formats suitable for printers that are unable to interpret POSTSCRIPT. A benchmark input file is provided so that the benchmark application processes the same data in evaluating each design.

The execution time of the i-cache 1209 and d-cache 1207 (the first level cache L1) depend on the design of the u-cache 1211. Initially, the design times for the i-cache 1209, d-cache 1207, and u-cache 1211 are expressed as cache misses, i.e., the number of times data requested from a cache component is not available in the cache component. The actual execution time associated with a first level L1 cache miss depends on the number of access cycles required to access the u-cache 1211. The execution time associated with a second level L2 cache miss depends on the time required to access main memory. The probability of a cache miss in a cache component depends on the size of the cache component. In evaluating the cache memory 1205 or the cache components (the i-cache 1209, the d-cache 1207, and the u-cache 1211), the number of times requested data or instructions are not in the d-cache 1207, the i-cache 1209, or the u-cache 1211 is obtained based upon the simulated execution of the GHOSTSCRIPT application program.

The cache components can be configured in several ways. The cache components can be divided into memory banks (sometimes referred to as "ways") with the ways being further divided into "lines." Lines are the smallest independently addressable memory blocks in the cache. The cache components can use any of several hashing algorithms for determining a cache location for storing data from a particular main memory location. If data from any main memory address can be replicated anywhere in the cache, then the cache is referred to as a fully-associative cache. A cache divided into N memory banks such that data from any main memory address can be replicated in any of the N memory banks is referred to as an N-way set-associative cache. A 1-way set-associative cache is generally referred to as a direct-mapped cache. An N-way set-associative cache is said to have an "associativity" of N.

In the cache design example described below, the line sizes for the d-cache 1207, i-cache 1209, and u-cache 1211 are fixed at 16 bytes, 32 bytes, and 32 bytes, respectively. In the design process, the d-cache 1209 is assumed to be a direct mapped cache, while the designs of the i-cache 1209 and u-cache 1207 are considered having associativities of 1, 2 and 2, 4, respectively. In other cache designs, these parameters can be allowed to vary or take on additional values. The memory sizes and line sizes of the cache components are restricted to powers of 2.

Figure 13:
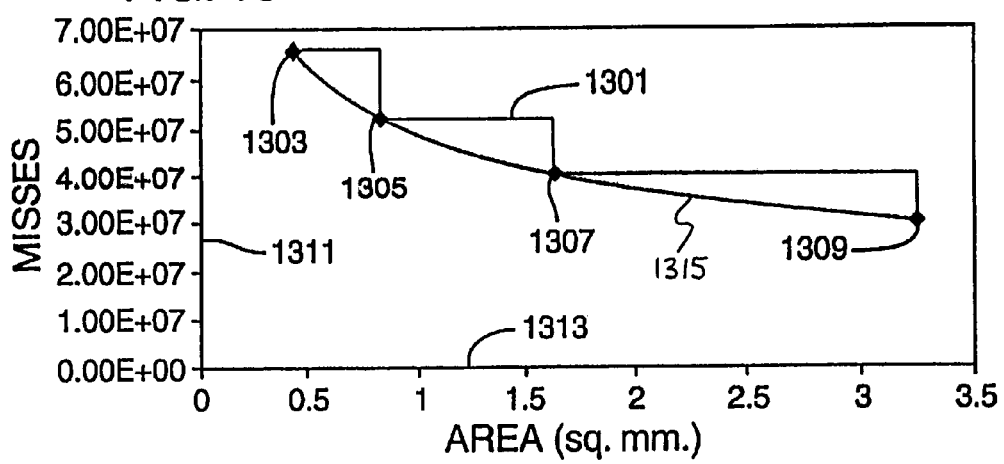
FIG. 13 contains a Pareto curve for the instruction cache of FIG. 12.

Each of the cache components is evaluated individually. The d-cache 1207 is evaluated as a function of cache size only, as a direct mapped cache with a line size of 16 bytes. FIG. 13 contains a Pareto curve 1301 for the d-cache 1207 for cache sizes of 2, 4, 8, and 16 kB. FIG. 13 also shows Pareto designs 1303, 1305, 1307, 1309 for the d-cache 1207. The Pareto curve 1301 is graphed with design execution time (d-cache misses $N_d$) on a vertical axis 1311 and cache cost (wafer area) on a horizontal axis 1313. An approximate Pareto curve 1315 connects the Pareto designs 1303, 1305, 1307, 1309.

Figure 14:
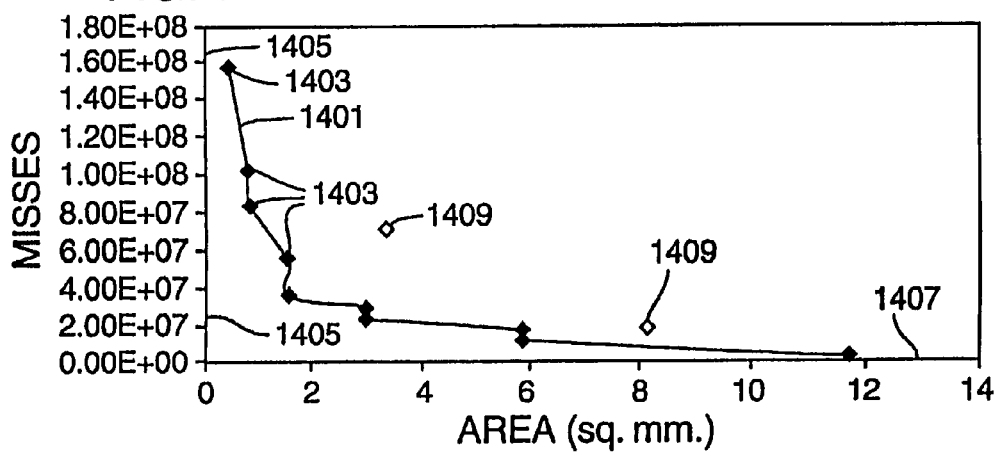
FIG. 14 contains a Pareto curve for the data cache of FIG. 12.

The line size of the i-cache 1209 is fixed at 32 bytes. The size of the i-cache 1209 ranges from 2 kB to 64 kB and associativities of 1 and 2 are considered. The costs and execution times for these combinations of size and associativity are determined based on the number of cache misses in the i-cache 1207 as a function of cache size based on the simulated execution of the GHOSTSCRIPT application with a predetermined design of the VLIW processor 1201. FIG. 14 contains a Pareto curve 1401 for the i-cache 1209 that is plotted with respect to coordinate axes 1405, 1407 corresponding to execution time (i.e., i-cache misses $N_i$) and cost, respectively. FIG. 14 also shows Pareto design points 1403 as well as non-Pareto design points 1409. The Pareto curve 1401 eclipses the non-Pareto design points 1409. As discussed above, the execution time is determined as a number of i-cache misses, i.e., the number of times the VLIW processor 1201 is unable to retrieve the requested instruction directly from the i-cache 1207 while executing the GHOSTSCRIPT application.

Figure 15:
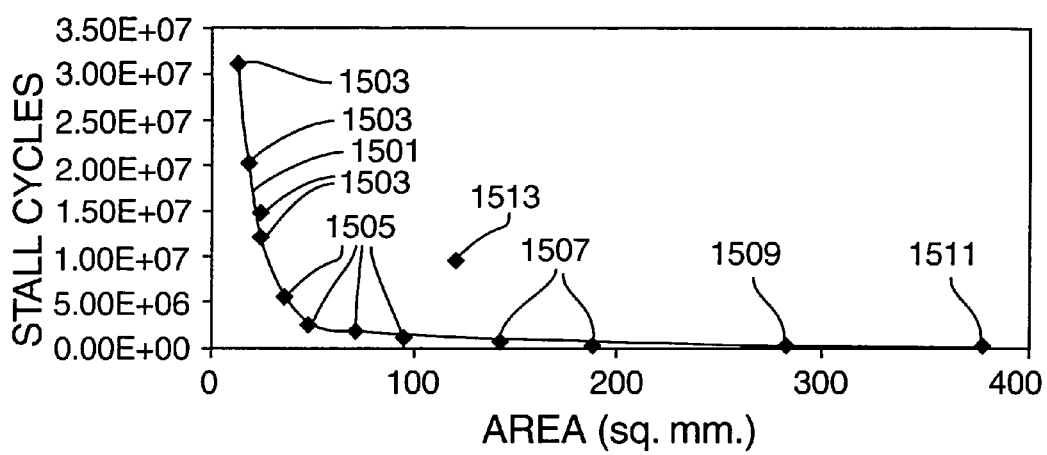
FIG. 15 contains a Pareto curve for the unified cache of FIG. 12.

For both the d-cache 1207 and the i-cache 1209, the actual execution time depends on the design of the u-cache 1211. Design of the u-cache 1211 is considered next. Design variables for the u-cache 1211 considered in this design example include cache size (64 kB to 2 MB) and associativities (2 and 4). The u-cache 1211 communicates with main memory via a system bus and requires a main memory cycle time $t_{main}$ to retrieve data from main memory. The u-cache designs considered require an access time ($t_{access}$) that is equivalent to 3–7 processor clock cycles to a supply not found in the i-cache 1207 or the d-cache 1209. FIG. 15 contains a component Pareto curve 1501 for the u-cache 1211 and Pareto design points 1503, 1505, 1507, 1509, 1511 that correspond to access times of 3, 4, 5, 6, and 7 processor clock cycles, respectively. FIG. 15 also shows non-Pareto design point 1513. For convenience, the Pareto curve 1501 is shown as a smooth curve connecting the Pareto design points.

Figure 16:
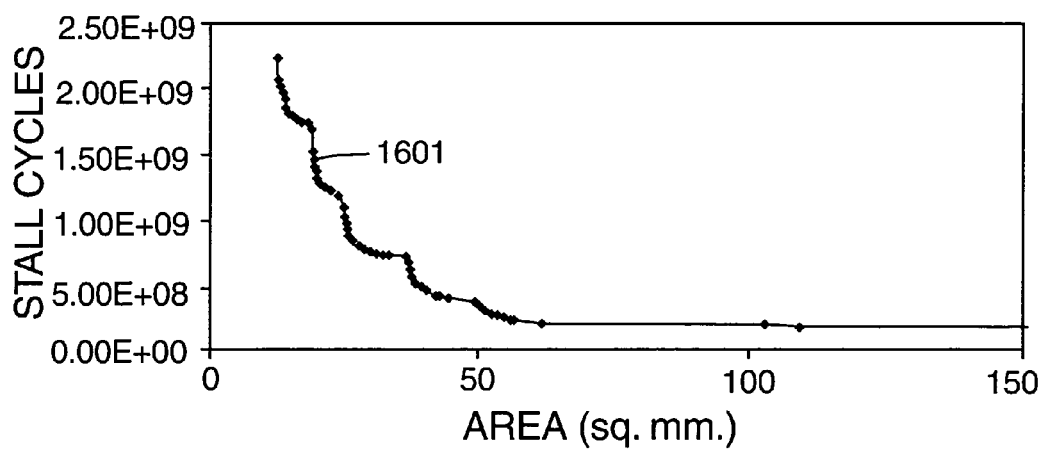
FIG. 16 contains a Pareto curve for the cache memory of FIG. 12.

FIG. 16 contains a combined Pareto curve 1601 obtained from the component Pareto curves 1301, 1401, 1501. To obtain the combined Pareto curve 1601, a Pareto design point is selected from each of the Pareto curves 1301, 1401, 1501 and the corresponding costs and the execution times are summed. The costs are summed directly. The design execution time is obtained as the sum $(N_d+N_i)$ $*t_{access}+N_u*t_{main}$. As shown in FIG. 16, the design execution time is conveniently expressed in terms of stall cycles, i.e., the number of processor clock cycles for which the VLIW processor 1201 waits for the necessary instruction or data to be retrieved. Inspection of FIG. 16 permits selection of a cache design based on cost and design execution time. There are no designs superior to (i.e., which eclipse) the designs of FIG. 16 and selection of a design from FIG. 16 permits selecting a preferred combination of cost and execution time. Alternatively, a cache design can be selected based on a combined Pareto set (the design points that define the combined Pareto curve 1601), instead of the graphical representation of the Pareto set.

Figure 18:
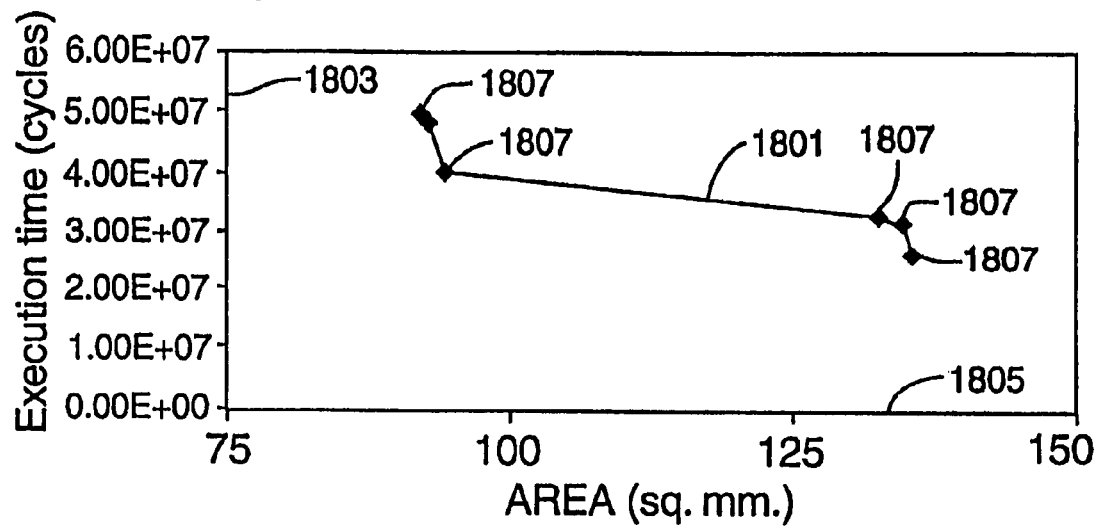
FIG. 18 contains a Pareto curve for the VLIW processor of FIG. 12.

A design for a combination of the VLIW processor 1201 and the cache memory 1205 can similarly be selected using component Pareto curves. First, component Pareto curves are obtained for the VLIW processor 1201 and the cache memory 1205. FIG. 16 contains the combined Pareto curve 1601 for the cache memory 1205. The Pareto curve 1601 serves as a component Pareto curve for the VLIW processor/cache memory system. A component Pareto curve for the VLIW processor 1201 is prepared as described above and is shown as a curve 1801 in FIG. 18. Execution time (number of VLIW processor cycles) is graphed along a vertical axis 1803 and cost (area) is graphed along a horizontal axis 1805. FIG. 18 also shows VLIW processor Pareto design points 1807.

Figure 19:
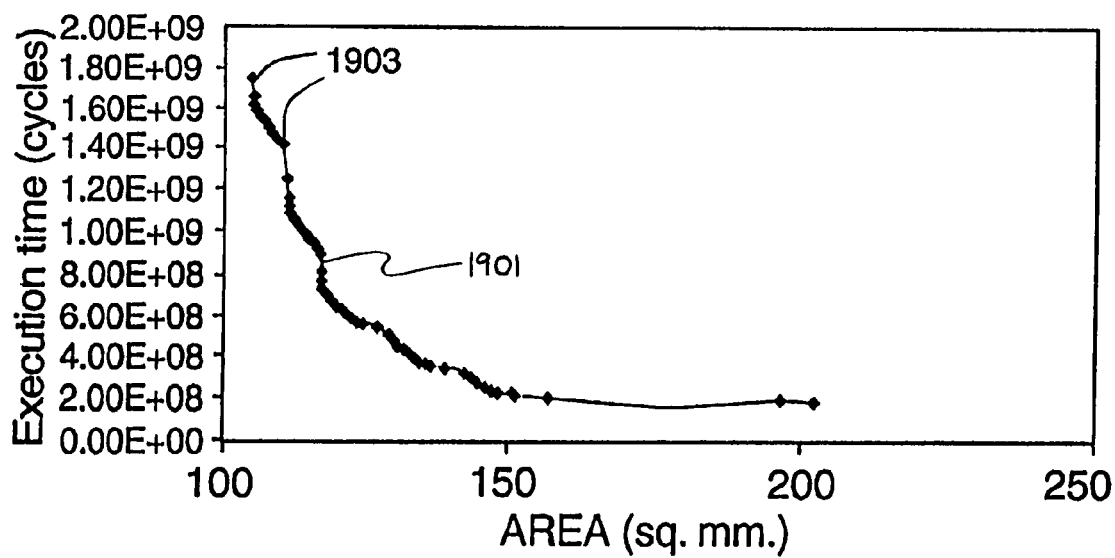
FIG. 19 contains a Pareto curve for the processor system of FIG. 12.

FIG. 19 contains a combined Pareto curve 1901 obtained with the Pareto curves 1601, 1801 of FIGS. 16, 18, respectively. Pareto design points 1903 are obtained by selecting a Pareto design point from both the Pareto curves 1601, 1801 and summing the costs (areas) and execution times.

Figure 17:
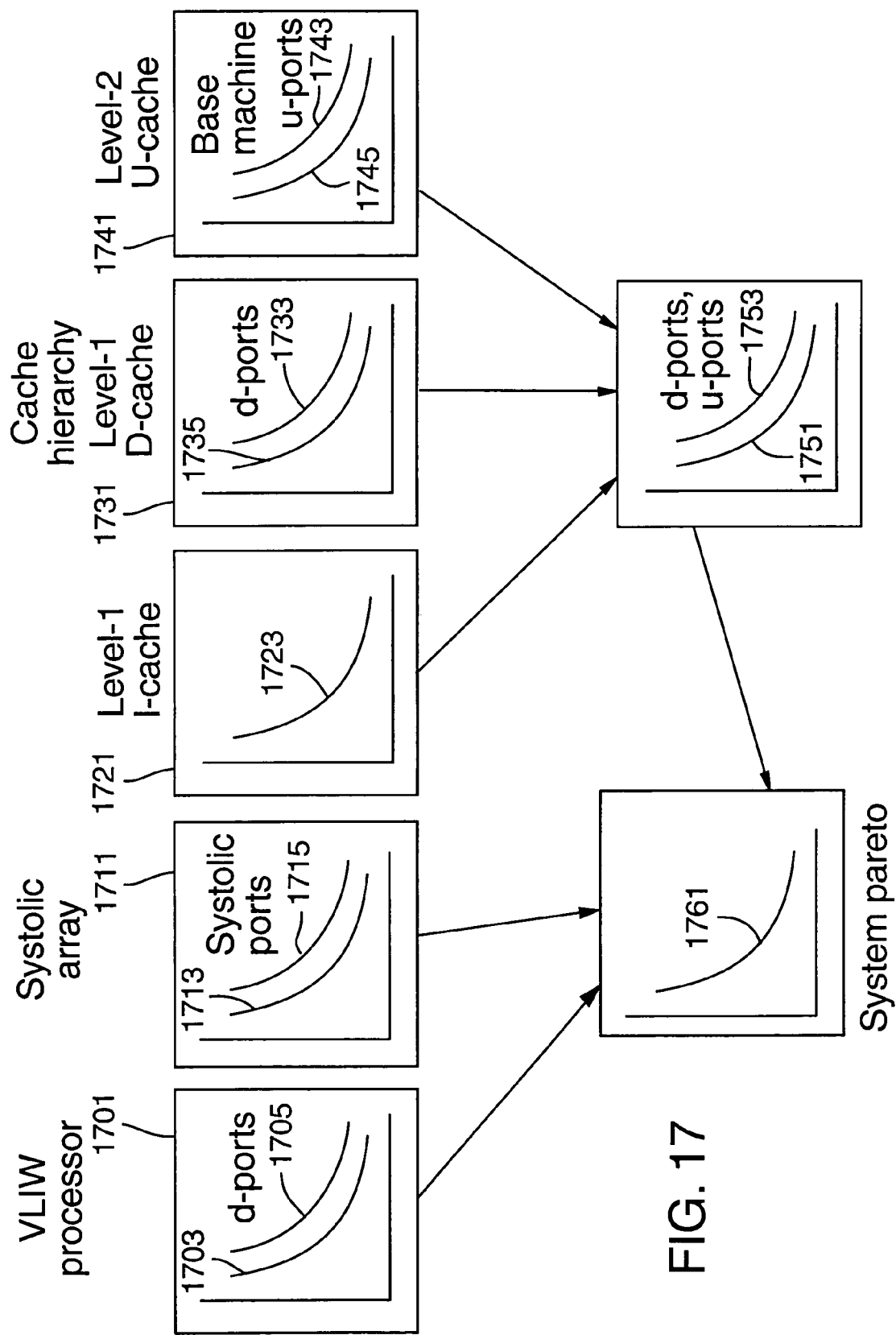
FIG. 17 contains Pareto curves illustrating the programmatic selection of a design for the processor system of FIG. 12.

As yet another example of design selection using component Pareto sets or curves to form a comprehensive Pareto set, a design for the VLIW processor system 1200 of FIG. 12 can be selected using component Pareto sets or curves for the VLIW processor 1201, the systolic array 1203, and the combined cache 1205 to prepare a combined Pareto set. As in the previous examples, the performance criteria are cost and execution time. FIG. 17 contains graphs of the component Pareto curves. In this example, VLIW processor designs are considered having various numbers of data ports for communication with the d-cache 1209. A graph 1701 of component Pareto curves for the VLIW processor 1201 includes curves 1703, 1705 that represent component Pareto curves for different numbers of d-ports. Similarly, a graph 1711 of component Pareto curves for the systolic array 1203 includes component Pareto curves 1713, 1715 for different numbers of systolic ports 1217.

Component Pareto curves are also prepared for the i-cache 1209, d-cache 1207, and the u-cache 1211. A graph 1721 contains a component Pareto curve 1723 for the i-cache 1209 and is prepared as described above. A graph 1731 contains component Pareto curves 1733, 1735 for the d-cache 1209, the curves 1733, 1735 corresponding to different numbers of data ports 1215. While only two curves 1733, 1735 are shown, additional numbers of data ports 1215 can be considered. The execution time of the d-cache 1209 is independent of the number of data ports 1215, but cost is not. Similarly, a graph 1741 contains component Pareto curves 1743, 1745 for the u-cache 1211 corresponding to different numbers of u-cache ports 1219. The component Pareto curves corresponding to the d-cache 1209, the i-cache 1207 and the u-cache 1211 are combined to produce comprehensive Pareto curves 1751, 1753 corresponding to different numbers of data ports 1215 and u-cache ports 1219. The combined Pareto curves 1751, 1753 are component Pareto curves with respect to the processor system 1200.

A combined Pareto curve 1761 is then prepared from the component Pareto curves 1703, 1705 (for the VLIW processor 1201), 1713, 1715 (for the systolic array 1203), and 1751, 1753 (for the cache memory 1205). In preparing the combined Pareto curves (or sets), only designs having equal numbers of data ports 1215 for both the VLIW processor 1201 and the d-cache 1209 are combined. Combinations of component Pareto designs in which the numbers of d-ports 1215, u-ports 1219, or other interconnection parameters are unmatched are not used in preparing the combined Pareto curve 1761.

In the above design examples, the selected performance criteria are execution time and cost. Additional design variables such as dilation or power consumption can be considered in finding the component Pareto sets. These additional performance criteria can be considered along with execution time and cost, or other combinations of performance criteria.

Having illustrated and demonstrated the principles of the invention in example embodiments, it should be apparent to those skilled in the art that the embodiments can be modified in arrangement and detail without departing from such principles. We claim as the invention all that comes within the scope of the following claims.

What is claimed is:

1. A method of programmatically selecting system designs from a system design space, the method comprising:
specifying system designs as combinations of component designs from respective component design spaces;
applying component quality filters to the component design spaces to produce component Pareto sets of designs; and
forming a Cartesian product of the component Pareto sets to obtain a set of system designs.

2. The method of claim 1, further comprising applying component validity filters to respective component design spaces before applying the component quality filters, wherein the component Pareto sets of designs include only designs satisfying respective component validity filters.

3. The method of claim 1, further comprising applying a system validity filter to the set of system designs to produce a validity filtered set of system designs.

4. The method of claim 3, further comprising applying a system quality filter to the set of system designs.

5. The method of claim 1, further comprising applying a system quality filter to the set of system designs.

6. A method of programmatically selecting system designs that are specified by combinations of component designs, the method comprising:
preparing component validity sets for each of the component designs by applying component validity filters to corresponding component design spaces, the component validity filters defined by corresponding component validity predicates;
forming a set of system designs that is a Cartesian product of the component validity sets; and
applying a system quality filter to the Cartesian product of the component validity sets to produce a Pareto set.

7. The method of claim 6, wherein the component designs are specified by component parameters, and the component validity filter for each component is independent of the component parameters of other components.

8. The method of claim 6, further comprising applying a system validity filter to the Cartesian product of the component validity sets.

9. The method of claim 6, further comprising applying a component evaluation function to the component validity sets.

10. The method of claim 6, further comprising applying a system evaluation function and the system quality filter to the Cartesian product of the component validity sets after applying a system validity filter.

11. The method of claim 10, further comprising applying a component evaluation function and a component quality filter to the component validity sets.

12. The method of claim 6, further comprising applying a component evaluation function and a component quality filter to at least one of the component validity sets before forming the set of system designs.

13. The method of claim 12, further comprising:
selecting a partial system design that includes component designs for at least one component;
obtaining a lower bound for an evaluation metric for a system design, wherein the system design includes the partial system design; and
comparing an evaluation metric of a system that includes the partial system design to the lower bound.

14. A method of selecting system designs that are specified by combinations of component designs, the method comprising:
preparing component validity sets for each of the component designs by applying component validity filters to corresponding component designs, the component validity filters defined by corresponding component validity predicates;
preparing component Pareto sets by applying corresponding component evaluation functions and component quality filters to the component validity sets; and
forming a set of system designs that is a Cartesian product of the component Pareto sets.

15. The method of claim 14, further comprising applying a system validity filter to the Cartesian product of the component Pareto sets.

16. The method of claim 14, further comprising applying a system evaluation function and a system quality filter to the Cartesian product of the component Pareto sets.

17. The method of claim 16, wherein the component evaluation functions and the system evaluation function produce component evaluation metrics and system evaluation metrics, respectively, and the system evaluation metrics are obtained from the component evaluation metrics.

18. A computer readable medium comprising computer executable instructions for performing the method of claim 1.

19. A computer readable medium comprising computer executable instructions for performing the method of claim 6.

20. A computer readable medium comprising computer executable instructions for performing the method of claim 14.

21. A method of programmatically selecting a system design from a set of system designs, comprising:
defining a system validity predicate that is a function of two or more terms;
defining partial validity predicates by expressing the system validity predicate in a canonical form;
applying partial validity filters that are defined by the partial validity predicates to the system designs to obtain partial validity sets;
applying a quality filter to the system designs of the partial validity sets to produce respective partial Pareto sets; and
combining the partial Pareto sets to form a Pareto set.

22. The method of claim 21, wherein each of the partial validity predicates is in product form.

23. The method of claim 21, wherein the partial validity predicates are mutually exclusive.

24. A method of programmatically selecting a set of system designs, comprising:
selecting a system validity filter defined by a system validity predicate, the system validity predicate including one or more partial validity predicates that define partial validity filters;
applying the partial validity filters to the system designs;
forming partial validity sets that include system designs satisfying respective partial validity filters;
applying an evaluation function to the system designs of the partial validity sets, the evaluation function producing an evaluation metric for each system design;
applying a quality filter to the system designs of the partial validity sets, the quality filter comparing and selecting system designs based on the evaluation metrics and producing respective partial Pareto sets; and
combining the partial Pareto sets to form a first Pareto set.

25. The method of claim 24, further comprising applying the quality filter to the first Pareto set.

26. The method of claim 24, wherein each of the partial validity predicates is in product form.

27. The method of claim 26, wherein the system validity predicate is a product of the partial validity predicates.

28. The method of claim 26, wherein the partial validity sets are combined to form two or more system validity sets.

29. A computer readable medium having computer executable instructions for performing the method of claim 24.

30. A computer readable medium having software for performing the method of claim 25.

31. A method of programmatically selecting a design for a cache memory, comprising:
   selecting components for the cache memory;
   preparing component Pareto curves for the components;
   preparing a combined Pareto curve from the component Pareto curves; and
   selecting a cache memory design from the combined Pareto curve.

32. A method of selecting a design for a processor system, the processor system including a processor and a cache memory, the method comprising:
   preparing a component Pareto curve for the processor;
   preparing a component Pareto curve for a cache memory;
   preparing a combined Pareto curve from the component Pareto curves of the processor and the cache memory; and
   selecting a processor system design from the combined Pareto curve.

33. A method of programmatically generating a set of designs for a processor system, comprising:
   dividing the processor system into at least a processor component and a memory component;
   preparing component validity sets for the processor component and the memory component;
   preparing component Pareto sets for the processor component and the memory component; and
   forming a Cartesian product of the component Pareto sets to produce the set of designs for the processor system.

34. The method of claim 33, further comprising applying a system evaluation function and a system quality filter to the Cartesian product of the component Pareto sets.

35. A method of designing a processor system that includes a processor component and a memory component, comprising:
   determining component validity sets for the processor component and the memory component;
   dividing at least one of the component validity sets into subsets;
   applying component quality filters to the component designs from the component validity sets and the subsets to produce component Pareto sets of designs; and
   forming a Cartesian product of the component Pareto sets to obtain a set of system designs.

36. A method of generating a set of partial validity predicates for a system design that includes component designs for at least a first component and a second component, the method comprising:
   obtaining a system validity function defined by a system validity predicate;
   identifying coupled terms in the system validity predicate, the coupled terms including parameters of the components; and
   producing a set of system designs that is a Cartesian product of component Pareto sets.

37. The method of claim 36, wherein the system design is a processor system design and the components include a processor component and a memory component.

38. The method of claim 37, further comprising expanding the coupled terms to obtain singleton terms containing parameters of only the processor component and singleton terms containing parameters of only the memory component.

39. The method of claim 36, further comprising expanding the coupled terms to obtain singleton terms containing parameters of only the first component and singleton terms containing parameters of only the second component.

40. The method of claim 39, further comprising expressing the system validity predicate in canonical form.

41. The method of claim 36, further comprising expressing the system validity predicate in canonical form.

* * * * *